(12) United States Patent
Tokunaga et al.

(10) Patent No.: US 9,389,503 B2
(45) Date of Patent: Jul. 12, 2016

(54) MANUFACTURING METHOD OF CONDUCTIVE SHEET AND CONDUCTIVE SHEET

(71) Applicant: FUJIFILM Corporation, Tokyo (JP)

(72) Inventors: Tsukasa Tokunaga, Ashigara-kami-gun (JP); Shin Tajiri, Ashigara-kami-gun (JP); Makoto Sutou, Ashigara-kami-gun (JP); Toshinari Fujii, Ashigara-kami-gun (JP); Shinichi Nakahira, Ashigara-kami-gun (JP); Kensuke Katagiri, Ashigara-kami-gun (JP); Nozomu Tonoike, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/706,564

(22) Filed: May 7, 2015

(65) Prior Publication Data

US 2015/0234271 A1 Aug. 20, 2015

Related U.S. Application Data

(63) Continuation of application No. PCT/JP2013/080402, filed on Nov. 11, 2013.

(30) Foreign Application Priority Data

Nov. 12, 2012 (JP) .................................. 2012-248249
Jun. 10, 2013 (JP) .................................. 2013-121727

(51) Int. Cl.

| G03C 1/047 | (2006.01) |
| G03C 1/053 | (2006.01) |
| H05K 3/00 | (2006.01) |
| G03F 7/004 | (2006.01) |
| G03F 7/20 | (2006.01) |
| G03F 7/16 | (2006.01) |
| G03F 7/40 | (2006.01) |
| H05K 3/10 | (2006.01) |

(52) U.S. Cl.
CPC .............. *G03F 7/0043* (2013.01); *G03C 1/047* (2013.01); *G03C 1/053* (2013.01); *G03F 7/168* (2013.01); *G03F 7/20* (2013.01); *G03F 7/40* (2013.01); *H05K 3/106* (2013.01); *G03C 2001/0475* (2013.01); *G03C 2001/0478* (2013.01)

(58) Field of Classification Search
CPC ......... G03F 7/0043; G03F 7/168; G03F 7/20; G03F 7/40; G03C 1/047; G03C 1/052; G03C 1/85; G03C 1/915; G03C 2001/0475; G03C 2001/0478; G03C 5/04; H05K 3/105; H05K 3/106; H05K 1/092; H05K 2201/0215; H05K 2203/122
USPC .................................. 430/14, 311, 319, 321
See application file for complete search history.

(56) References Cited

U.S. PATENT DOCUMENTS

| 2002/0004180 A1 | 1/2002 | Hotta et al. | |
| 2007/0138441 A1 | 6/2007 | Goto et al. | |
| 2007/0269675 A1* | 11/2007 | Ichiki | H05K 9/0096 428/603 |
| 2009/0233237 A1* | 9/2009 | Yoshiki | H05K 3/106 430/311 |
| 2009/0242236 A1* | 10/2009 | Fyson | C23C 18/1608 174/250 |
| 2009/0324902 A1* | 12/2009 | Tokunaga | G03C 1/853 428/195.1 |
| 2010/0243923 A1* | 9/2010 | Sakuyama | H05K 9/0096 250/515.1 |

FOREIGN PATENT DOCUMENTS

| JP | 2001-264914 A | 9/2001 |
| JP | 2001-345537 A | 12/2001 |
| JP | 2010-205927 A | 9/2010 |
| JP | 4895536 B | 1/2012 |
| JP | 2012-146548 A | 8/2012 |
| JP | 2012-234695 A | 11/2012 |
| WO | 2007/001008 A1 | 1/2007 |
| WO | 2007/069495 A1 | 6/2007 |

OTHER PUBLICATIONS

International Search Report of PCT/JP2013/080402 dated Feb. 10, 2014, 2 pages in English.
International Preliminary Report on Patentability and Written Opinion, issued May 12, 2015, issued in corresponding International Application No. PCT/JP2013/080402, 12 pages in English and Japanese.

* cited by examiner

*Primary Examiner* — John A McPherson
(74) *Attorney, Agent, or Firm* — Sughrue Mion, PLLC

(57) ABSTRACT

A manufacturing method of a conductive sheet includes: a step A of forming a silver halide-containing photosensitive layer, which contains silver halide, gelatin, and a polymer different from the gelatin and in which a mass ratio (Y/X) of a mass Y of the polymer to a mass X of the gelatin is equal to or greater than 0.1, on a support; a step B of forming conductive portions containing metal silver by performing exposure and then development treatment on the silver halide-containing photosensitive layer; and a step C of treating the support having the conductive portions with an oxidant which has a standard electrode potential of equal to or greater than +1.5 V and decomposes the gelatin.

25 Claims, 2 Drawing Sheets

MANUFACTURING METHOD OF CONDUCTIVE SHEET AND CONDUCTIVE SHEET

CROSS-REFERENCE TO RELATED APPLICATIONS

This application is a Continuation of PCT International Application No. PCT/JP2013/080402 filed on Nov. 11, 2013, which claims priority under 35 U.S.C. §119(a) to Japanese Patent Application No. 2012-248249 filed on Nov. 12, 2012 and Japanese Patent Application No. 2013-121727 filed on Jun. 10, 2013. Each of the above application(s) is hereby expressly incorporated by reference, in its entirety, into the present application.

BACKGROUND OF THE INVENTION

The present invention relates to a manufacturing method of a conductive sheet. Particularly, the present invention relates to a manufacturing method of a conductive sheet that includes a step of decomposing and removing gelatin by using an oxidant having a predetermined standard electrode potential.

Furthermore, the present invention also relates to a conductive sheet.

A conductive sheet, in which thin conductive wires have been formed on a support, is widely used in a transparent electrode of various electronic devices such as a solar cell, an inorganic EL element, and an organic EL element, an electromagnetic wave shield of various display apparatuses, a touch panel, a transparent sheet-type heating element, and the like. Particularly, in recent years, as a touch panel has been more frequently mounted on cellular phones, mobile game consoles, or the like, a demand for a conductive sheet for capacitance type touch panels that can perform multipoint detection has rapidly increased. As a method for forming such a conductive sheet, a method for forming thin conductive wires with low resistance from a silver image which is obtained by developing a silver halide photographic sensitive material is under examination.

Meanwhile, the thin conductive wires containing silver manufactured from the silver halide photographic sensitive material have a problem of easily causing ion migration. When the ion migration occurs between the thin conductive wires, the thin conductive wires become conductive to each other, and thus the wires cannot function as a circuit.

As a method for preventing the ion migration, JP 2010-205927 A suggested a method of cross-linking a resin component such as gelatin after an electrode pattern is formed.

Moreover, JP 4895536 B suggested a method of decomposing gelatin by treating the gelatin with an enzyme-containing treatment solution that contains an enzyme acting on gelatin.

SUMMARY OF THE INVENTION

Meanwhile, in recent years, as the products have been required to be further miniaturized and to have higher performance, the wiring interval has been narrowed, and the conduction of a circuit has more easily occurred due to ion migration. Particularly, in the field of touch panels, a busbar and lead-out wiring are desired to be formed such that they are positioned within a very narrow frame range at the edge of a panel. Consequently, in this situation, the space between wirings in a peripheral wiring portion is reduced, and thus conduction easily occurs due to ion migration.

However, in a case in which the wiring interval has been narrowed as described above, the method described in JP 2010-205927 A does not necessarily bring about a sufficient effect, and accordingly, the method needs to be further improved.

Moreover, even when the enzyme described in JP 4895536 B is used, a sufficient effect is not necessarily exerted, and accordingly, the method needs to be further improved.

The present invention has been made in consideration of the above present circumstances, and objects thereof are to provide a conductive sheet, in which the occurrence of ion migration between conductive portions has been further inhibited, and to provide a manufacturing method of the conductive sheet.

As a result of conducting intensive examination to achieve the above objects, the present inventors found that by performing an operation of treating gelatin, which highly correlates with the occurrence of ion migration, with a predetermined oxidant, the gelatin is decomposed and removed, and intended effects are obtained.

That is, the present inventors found that the above objects can be accomplished by the following constitution.

(1) A manufacturing method of a conductive sheet, comprising:

a step A of forming a silver halide-containing photosensitive layer, which contains silver halide, gelatin, and a polymer different from the gelatin and in which a mass ratio (Y/X) of a mass Y of the polymer to a mass X of the gelatin is equal to or greater than 0.1, on a support;

a step B of forming conductive portions containing metal silver by performing exposure and then development treatment on the silver halide-containing photosensitive layer; and a step C of treating the support having the conductive portions with an oxidant which has a standard electrode potential of equal to or greater than +1.5 V and decomposes the gelatin.

(2) The manufacturing method of a conductive sheet according to (1), wherein the oxidant is aqueous hydrogen peroxide or sodium hypochlorite.

(3) The manufacturing method of a conductive sheet according to (1) or (2), wherein the silver halide-containing photosensitive layer further contains a crosslinking agent cross-linking the polymers to each other.

(4) The manufacturing method of a conductive sheet according to any one of (1) to (3), wherein the support is a treated support having undergone at least one type of treatment selected from the group consisting of atmospheric pressure plasma treatment, corona discharge treatment, and ultraviolet irradiation treatment.

(5) The manufacturing method of a conductive sheet according to any one of (1) to (4), wherein the support has an undercoat layer, which contains a polymer different from the gelatin, on the surface thereof.

(6) The manufacturing method of a conductive sheet according to any one of (1) to (5), further comprising, before the step A, a step of forming a silver halide-free layer, which contains gelatin and a polymer different from the gelatin, on the support.

(7) The manufacturing method of a conductive sheet according to any one of (1) to (6), further comprising, between the step A and the step B, a step of forming a protective layer, which contains gelatin and a polymer different from the gelatin, on the silver halide-containing photosensitive layer.

(8) The manufacturing method of a conductive sheet according to (7), wherein a mass ratio (the mass of the polymer/the mass of the gelatin) of the polymer to the gelatin in the protective layer is greater than 0 and equal to or less than 1.0.

(9) The manufacturing method of a conductive sheet according to any one of (1) to (8), further comprising, between the step B and the step C and/or after the step C, a step of performing reduction treatment by treating the support having the conductive portions with a reducing aqueous solution.

(10) The manufacturing method of a conductive sheet according to any one of (1) to (9), further comprising, between the step B and the step C and/or after the step C, a step of irradiating the conductive portions with pulsed light from a xenon flash lamp.

(11) The manufacturing method of a conductive sheet according to (10), wherein when the conductive portions are irradiated with the pulsed light from the xenon flash lamp, the irradiation energy per pulse is equal to or less than 1,500 J, and the number of times the pulsed light is radiated is equal to or less than 2,000.

(12) The manufacturing method of a conductive sheet according to any one of (1) to (11), further comprising, between the step B and the step C and/or after the step C, a step of performing smoothing treatment on the conductive portions.

(13) The manufacturing method of a conductive sheet according to (12), wherein the smoothing treatment is calender treatment in which the support having the conductive portions is passed through at least a pair of rolls under a condition of a linear pressure of 20 kgf/cm to 700 kgf/cm.

(14) The manufacturing method of a conductive sheet according to (13), wherein a surface roughness Ra of the rolls is 0 µm to 2.0 µm.

(15) The manufacturing method of a conductive sheet according to any one of (1) to (14), further comprising, between the step B and the step C and/or after the step C, a step of performing heating treatment on the support having the conductive portions.

(16) The manufacturing method of a conductive sheet according to (15), wherein the heating treatment is treatment for bringing the support having the conductive portions into contact with superheated vapor.

(17) The manufacturing method of a conductive sheet according to (15), wherein the heating treatment is heating treatment performed at 80° C. to 150° C.

(18) The manufacturing method of a conductive sheet according to any one of (1) to (17), further comprising, after the step C, a step of bringing the support having the conductive portions into contact with a migration inhibitor.

(19) The manufacturing method of a conductive sheet according to any one of (1) to (18), further comprising, after the step C, a step of bringing the support having the conductive portions into contact with an organic solvent.

(20) The manufacturing method of a conductive sheet according to (19), wherein the organic solvent is a solvent dissolving the polymer.

(21) The manufacturing method of a conductive sheet according to (18) or (19), wherein the organic solvent is an organic solvent having an SP value within a range of 8.0 to 12.0.

(22) A conductive sheet comprising:

a support;

conductive portions which are disposed on the support and contain metal silver and a resin binder; and resin binder portions each of which is present between the conductive portions, wherein each of the conductive portions has a lower layer not containing metal silver, an intermediate layer containing metal silver, and an upper layer not containing metal silver in this order, an average thickness of the upper layer is equal to or less than 0.40 µm, and a hydrophobization rate A determined by the hydrophobization rate A-measuring method described later is equal to or greater than 90.

(23) The conductive sheet according to (22), wherein a hydrophobization rate B determined by the hydrophobization rate B-measuring method described later is equal to or greater than 90.

(24) The conductive sheet according to (22) or (23), wherein an average thickness of the upper layer is equal to or less than 0.20 µm.

(25) The conductive sheet according to any one of (22) to (24), wherein a difference (T2−T3) between an average thickness T2 of the resin binder portions and an average thickness T3 of the lower layer is greater than 0.02 µm.

According to the present invention, it is possible to provide a conductive sheet, in which the occurrence of ion migration between conductive portions has been further inhibited, and a manufacturing method of the conductive sheet.

DETAILED DESCRIPTION OF THE INVENTION

Hereinafter, preferred embodiments of the conductive sheet of the present invention and preferred embodiments of the manufacturing method of the conductive sheet of the present invention will be described.

First, the characteristics of the present invention will be specifically described in comparison with the conventional technique.

In the present invention, it was found that if gelatin in a predetermined amount and a polymer different from the gelatin (hereinafter, the polymer will be also simply referred to as a "polymer") are used, and if the gelatin is efficiently decomposed and removed by using an oxidant having a predetermined standard electrode potential, it is possible to manufacture a conductive sheet in which the occurrence of ion migration has been further inhibited. If the gelatin and the aforementioned polymer in a predetermined amount are used, even after the gelatin is decomposed and removed, the polymer remains in conductive portions and assists metal silver particles to be connected to each other. Furthermore, if the gelatin is decomposed and removed by using an oxidant, the oxidant easily permeates the portion of gelatin inside the conductive portions, and consequentially, the gelatin is excellently decomposed and removed.

The manufacturing method of a conductive sheet of the present invention includes at least a step A of forming a predetermined silver halide-containing photosensitive layer on a support, a step B of performing exposure and development treatment on the silver halide-containing photosensitive layer, and a step C of treating the support with a predetermined oxidant.

Hereinafter, materials used in the respective steps and the procedure of the respective steps will be specifically described with reference to FIGS. 1A to 1C.

[Step a (Silver Halide-Containing Photosensitive Layer-Forming Step)]

The step A is a step of forming a silver halide-containing photosensitive layer, which contains silver halide, gelatine, and a polymer different from the gelatine, on a support (a silver halide-containing photosensitive layer-forming step). In the silver halide-containing photosensitive layer, a mass ratio (Y/X) of a mass Y of the polymer to a mass X of the gelatin is equal to or greater than 0.1. By this step, a support with a photosensitive layer that is subjected to exposure treatment, which will be described later, is manufactured.

Figure 1A:
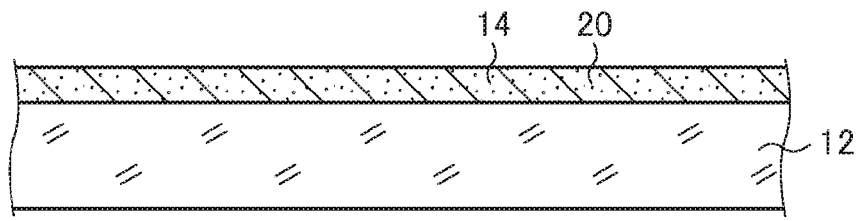
FIGS. 1A to 1C are views showing steps of a manufacturing method of a conductive sheet of the present invention.

More specifically, as shown in FIG. 1A, on a support 12, a silver halide-containing photosensitive layer 14, which contains silver halide 20 (for example, silver bromide particles, silver chlorobromide particles, or silver iodobromide particles), gelatin, and a polymer different from the gelatin, is formed. In FIGS. 1A and 1B, the silver halide 20 is described in the form of "grains". However, the drawings show the particles in an exaggerated form for just facilitating understanding of the present invention, and do not describe the size, concentration, or the like of the particles. Hereinafter, the silver halide-containing photosensitive layer will be also simply referred to as a photosensitive layer.

First, the materials and members used in the step A will be specifically described, and then the procedure of the step A will be specifically described.

(Support)

The type of the support is not limited as long as it can support conductive portions which will be described later. The support is preferably a transparent support, and particularly preferably a plastic film. If a transparent support is used, the conductive sheet of the present invention can be suitably used as a transparent conductive sheet.

Specific examples preferable as the materials constituting the support include plastic films having a melting point of equal to or less than about 290° C., such as PET (258° C.), polycycloolefin (134° C.), polycarbonate (250° C.), an acryl film (128° C.), PEN (269° C.), PE (135° C.), PP (163° C.), polystyrene (230° C.), polyvinyl chloride (180° C.), polyvinylidene chloride (212° C.), and TAC (290° C.). Among these, PET, polycyloolefin, and polycarbonate are particularly preferable. The numerical value in the parenthesis is a melting point. The total light transmittance of the support is preferably 85% to 100%.

The thickness of the support is not particularly limited. However, in view of applying the conductive sheet to a touch panel, an electromagnetic wave shield, and the like, generally, the thickness of the support can be randomly selected within a range of 25 μm to 500 μm. When the support is caused to function as a support of a transparent conductive film and as a touch surface, the support can also be designed to have a thickness exceeding 500 μm.

The support is substantially not dissolved in a sodium hypochlorite solution having an effective chlorine concentration of 5%, which is used in a method for a hydrophobization rate A-measuring method which will be described later, or in hot water (70° C.) used in a hydrophobization rate B-measuring method which will be described later.

As one of the preferred embodiments of the support, there can be exemplified a treated support having undergone at least one type of treatment selected from the group consisting of atmospheric pressure plasma treatment, corona discharge treatment, and ultraviolet irradiation treatment. If the above treatment is performed on the support, a hydrophilic group such as an OH group is introduced into the surface of the treated support, and the adhesiveness of the conductive portions which will be described later is further improved.

Among the above treatment, in view of further improving the adhesiveness of the conductive portions, the atmospheric pressure plasma treatment is preferable.

As another preferred embodiment of the support, the support preferably has an undercoat layer, which contains a polymer different from the gelatin which will be described later, on the surface thereof. If the photosensitive layer is formed on the undercoat layer, the adhesiveness of the conductive portions which will be described later is further improved.

The method for forming the undercoat layer is not particularly limited, and for example, there can be exemplified a method of coating the support with a composition for forming an undercoat layer containing a polymer and performing heating treatment on the support if necessary. If necessary, the composition for forming an undercoat layer may contain a solvent. The type of the solvent is not particularly limited, and examples thereof include the solvents used in a composition for forming a photosensitive layer which will be described later. Furthermore, as the composition for forming an undercoat layer containing a polymer, latex containing fine polymer particles may be used.

The thickness of the undercoat layer is not particularly limited. However, in view of better adhesiveness of the conductive portions, the thickness of the undercoat layer is preferably 0.02 μm to 0.3 μm, and more preferably 0.03 μm to 0.2 μm.

(Silver Halide)

The halogen element contained in the silver halide may be any one of chlorine, bromine, iodine, and fluorine, and these elements may be used in combination. For example, silver halide mainly constituted with silver chloride, silver bromide, or silver iodide is preferably used, and silver halide mainly constituted with silver bromide or silver chloride is more preferably used. Silver chlorobromide, silver iodochlorobromide, and silver iodobromide are also preferably used. Among these, silver chlorobromide, silver bromide, silver iodochlorobromide, and silver iodobromide are more preferable, and silver chlorobromide and silver iodochlorobromide containing silver chloride in an amount of equal to or greater than 50 mol % are most preferably used.

Herein, the "silver halide mainly constituted with silver bromide" refers to silver halide in which a molar fraction of bromide ions in a silver halide composition is equal to or greater than 50%. Particles of the silver halide mainly constituted with silver bromide may contain iodide ions or chloride ions in addition to the bromide ions.

The silver halide is in the form of solid particles. From the viewpoint of patterning properties of the conductive portions formed after the exposure and development treatment, the average particle size of the silver halide is preferably 0.1 nm to 1,000 nm (1 μm), more preferably 0.1 nm to 100 nm, and even more preferably 1 nm and 50 nm, in terms of a sphere equivalent diameter.

The "sphere equivalent diameter" of the silver halide particles means a diameter of particles having a spherical particle shape and the same volume.

The shape of the silver halide particles is not particularly limited, and the particles can have various shapes such as a spherical shape, a cuboid shape, a flat plate shape (a hexagonal flat plate shape, a triangular flat plate shape, a quadrangular flat plate shape, or the like), an octahedral shape, and a cuboctahedral shape.

Furthermore, regarding the use of metal compounds belonging to groups VIII and VIIIB, such as a rhodium compound and an iridium compound, and a palladium compound that are used for stabilizing silver halide and for increasing sensitivity of silver halide, the description in paragraphs [0039] to [0042] of JP 2009-188360 A can be referred to. Moreover, regarding chemical sensitization, the technique described in paragraph [0043] of JP 2009-188360 A can be referred to.

(Gelatin)

The type of the gelatin is not particularly limited, and for example, lime-treated gelatin and acid-treated gelatin may be used. It is also possible to use a hydrolysate of gelatin, an enzymatic decomposition product of gelatin, and gelatin modified with an amino group or a carboxyl group (phthalated gelatin or acetylated gelatin).

(Polymer)

The type of the polymer used is not particularly limited as long as it is different from the gelatin. However, a polymer that is not decomposed by an oxidant decomposing the gelatin, which will be described later, is preferable. Examples of the polymer include a hydrophobic polymer (hydrophobic resin) and the like. More specifically, examples thereof include any resin selected from the group consisting of acryl-based resin, styrene-based resin, vinyl-based resin, polyolefin-based resin, polyester-based resin, polyurethane-based resin, polyamide-based resin, polycarbonate-based resin, polydiene-based resin, epoxy-based resin, silicone-based resin, a cellulose-based polymer, a chitosan-based polymer, a copolymer composed of a monomer constituting theses resins, and the like.

The polymer preferably contains a reactive group that reacts with a crosslinking agent which will be described later.

Furthermore, as another preferred embodiment of the polymer, for example, a polymer (copolymer) represented by the following Formula (1) can be used because it can further prevent the permeation of moisture.

$$-(A)x\text{-}(B)y\text{-}(C)z\text{-}(D)w\text{-} \quad \text{Formula(1):}$$

In Formula (1), A, B, C, and D represent the following repeating units respectively.

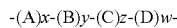

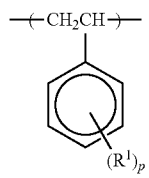
A

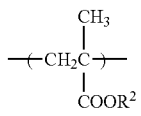
B

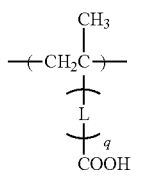
C

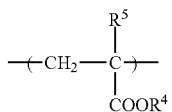
D $R^1$ represents a methyl group or a halogen atom, and preferably represents a methyl group, a chlorine atom, or a bromine atom. p represents an integer of 0 to 2. p is preferably 0 or 1, and more preferably 0.

$R^2$ represents a methyl group or an ethyl group, and is preferably a methyl group.

$R^3$ represents a hydrogen atom or a methyl group, and preferably represents a hydrogen atom. L represents a divalent linking group, and is preferably a group represented by the following Formula (2).

$$-(CO-X^1)r\text{-}X^2- \quad \text{Formula(2):}$$

In the formula, $X^1$ represents an oxygen atom or $-NR^{30}-$. Herein, $R^{30}$ represents a hydrogen atom, an alkyl group, an aryl group, or an acyl group, and each of these may have a substituent (for example, a halogen atom, a nitro group, or a hydroxyl group). $R^{30}$ is preferably a hydrogen atom, an alkyl group having 1 to 10 carbon atoms (for example, a methyl group, an ethyl group, a n-butyl group, or a n-octyl group), or an acyl group (for example, an acetyl group or a benzoyl group). $X^1$ is particularly preferably an oxygen atom or $-NH-$.

$X^2$ represents an alkylene group, an arylene group, an alkylene arylene group, an arylene alkylene group, or an alkylene arylene alkylene group. $-O-$, $-S-$, $-OCO-$, $-CO-$, $-COO-$, $-NH-$, $-SO_2-$, $-N(R^{31})-$, $-N(R^{31})SO_2-$, or the like may be inserted into the middle of these groups. Herein, $R^{31}$ represents a linear or branched alkyl group having 1 to 6 carbon atoms, such as a methyl group, an ethyl group, or an isopropyl group. Preferable examples of $X^2$ include a dimethylene group, a trimethylene group, a tetramethylene group, an o-phenylene group, a m-phenylene group, a p-phenylene group, $-CH_2CH_2OCOCH_2CH_2-$, $-CH_2CH_2OCO(C_6H_4)-$, and the like.

r represents 0 or 1.

q represents 0 or 1, and is preferably 0.

$R^4$ represents an alkyl group having 5 to 80 carbon atoms, an alkenyl group, or an alkynyl group. $R^4$ is preferably an alkyl group having 5 to 50 carbon atoms, more preferably an alkyl group having 5 to 30 carbon atoms, and even more preferably an alkyl group having 5 to 20 carbon atoms.

$R^5$ represents a hydrogen atom, a methyl group, an ethyl group, a halogen atom, or $-CH_2COOR^6$. $R^5$ is preferably a hydrogen atom, a methyl group, a halogen atom, or $-CH_2COOR^6$, more preferably a hydrogen atom, a methyl group, or $-CH_2COOR^6$, and particularly preferably a hydrogen atom.

$R^6$ represents a hydrogen atom or an alkyl group having 1 to 80 carbon atoms. $R^6$ may be the same as or different from $R^4$. The number of carbon atoms in $R^6$ is preferably 1 to 70, and more preferably 1 to 60.

In Formula (1), each of x, y, z, and w represents a molar ratio of each of the repeating units.

x represents 3 mol % to 60 mol %, preferably represents 3 mol % to 50 mol %, and more preferably represents 3 mol % to 40 mol %.

y represents 30 mol % to 96 mol %, preferably represents 35 mol % to 95 mol %, and particularly preferably represents 40 mol % to 90 mol %.

If z is too small, the affinity with hydrophilic protective colloid such as gelatin is reduced, and consequentially, a matting agent is highly likely to be aggregated and peeled off. If z is too great, the matting agent is dissolved in an alkaline treatment solution for the photosensitive material. Therefore, z represents 0.5 mol % to 25 mol %, preferably represents 0.5 mol % to 20 mol %, and particularly preferably represents 1 mol % to 20 mol %.

w represents 0.5 mol % to 40 mol %, and preferably represents 0.5 mol % to 30 mol %.

In Formula (1), a case is particularly preferable in which x represents 3 mol % to 40 mol %, y represents 40 mol % to 90 mol %, z represents 0.5 mol % to 20 mol %, and w represents 0.5 mol % to 10 mol %.

The polymer represented by Formula (1) is preferably a polymer represented by the following Formula (2).

Formula (2)

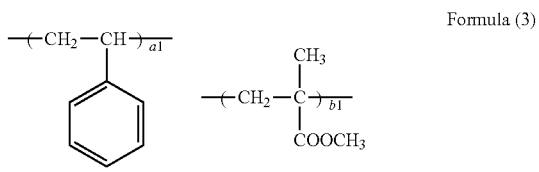

In Formula (2), x, y, z, and w have the same definition as described above.

The polymer represented by Formula (1) may contain other repeating units in addition to Formulae (A), (B), (C), and (D). Examples of monomers for forming other repeating units include acrylic acid esters, methacrylic acid esters, vinyl esters, olefins, crotonic acid esters, itaconic acid diesters, maleic acid diesters, fumaric acid diesters, acrylamides, unsaturated carboxylic acids, an allyl compound, vinyl ethers, vinyl ketones, a vinyl heterocyclic compound, glycidyl esters, unsaturated nitriles, and the like. These monomers are also described in paragraphs [0010] to [0022] of JP 3754745 B.

From the viewpoint of hydrophobicity, acrylic acid esters and methacrylic acid esters are preferable, and hydroxyalkyl methacrylate such as hydroxyethyl methacrylate or hydroxyalkyl acrylate is more preferable. The polymer represented by Formula (1) preferably contains a repeating unit represented by the following Formula (E) in addition to Formulae (A), (B), (C), and (D).

E

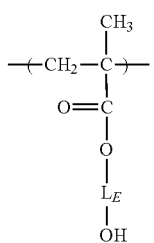

In the formula, $L_E$ represents an alkylene group. $L_E$ is preferably an alkylene group having 1 to 10 carbon atoms, more preferably an alkylene group having 2 to 6 carbon atoms, and even more preferably an alkylene group having 2 to 4 carbon atoms.

The polymer represented by Formula (1) is particularly preferably a polymer represented by the following Formula (3).

Formula (3)

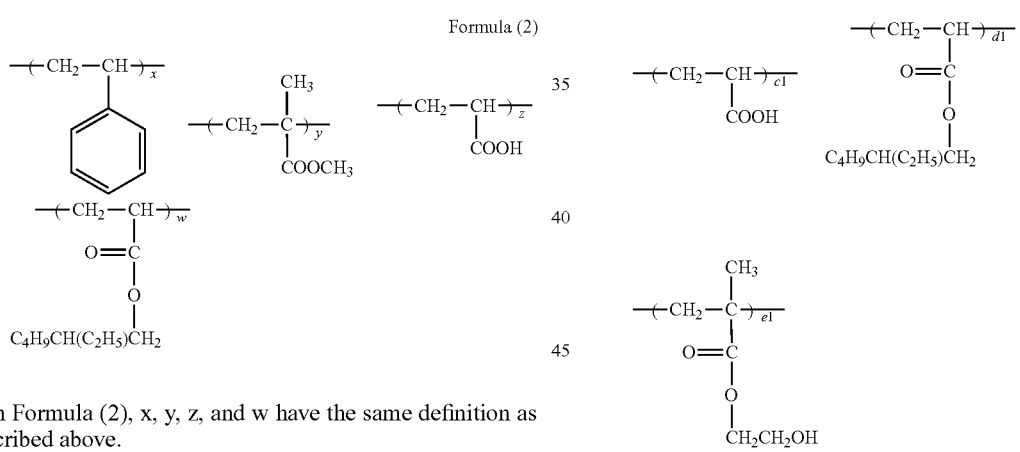

In the formula, each of a1, b1, c1, d1, and e1 represents a molar ratio of each monomer unit. a1 represents 3 to 60 (mol %), b1 represents 30 to 95 (mol %), c1 represents 0.5 to 25 (mol %), d1 represents 0.5 to 40 (mol %), and e1 represents 1 to 10 (mol %).

The preferable range of a1 is the same as the preferable range of x, the preferable range of b1 is the same as the preferable range of y, the preferable range of c1 is the same as the preferable range of z, and the preferable range of d1 is the same as the preferable range of w.

e1 represents 1 mol % to 10 mol %, preferably represents 2 mol % to 9 mol %, and more preferably represents 2 mol % to 8 mol %.

Specific examples of the polymer represented by Formula (1) will be shown below, but the polymer is not limited to the examples.

(P-1) 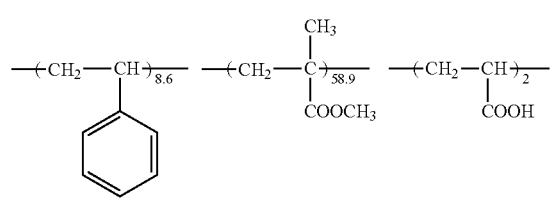
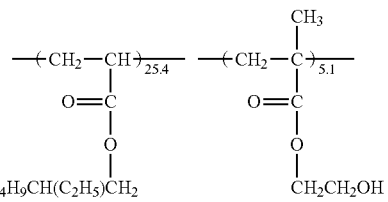
(P-2) 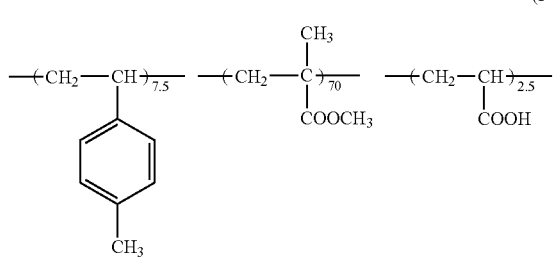
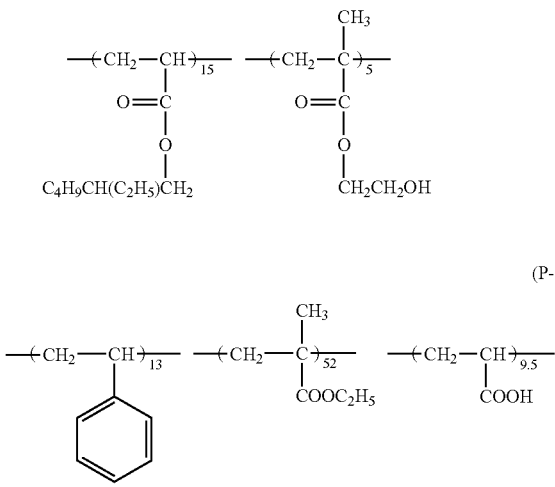
(P-3) 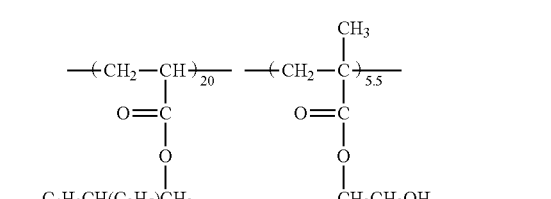
(P-4) 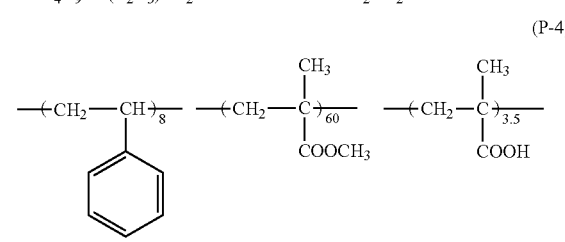
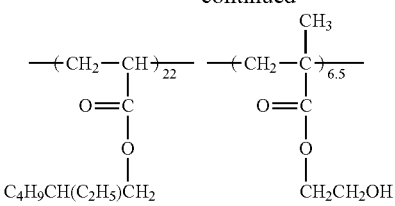
(P-5) 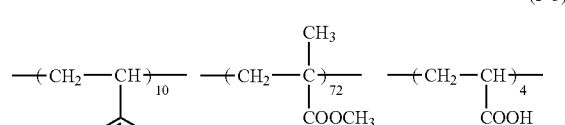
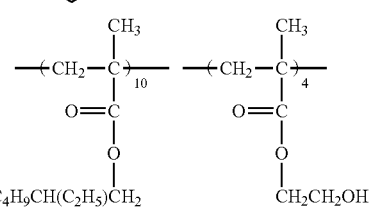
(P-6) 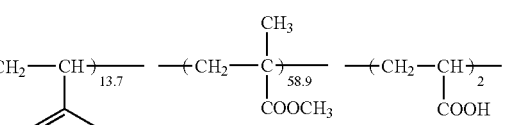
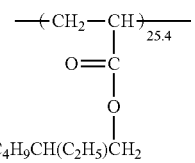
(P-7) 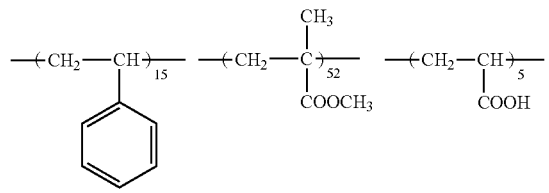
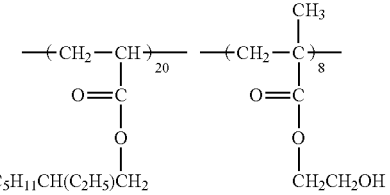
(P-8) 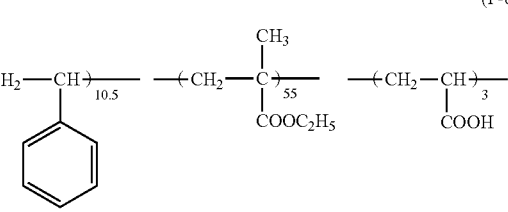

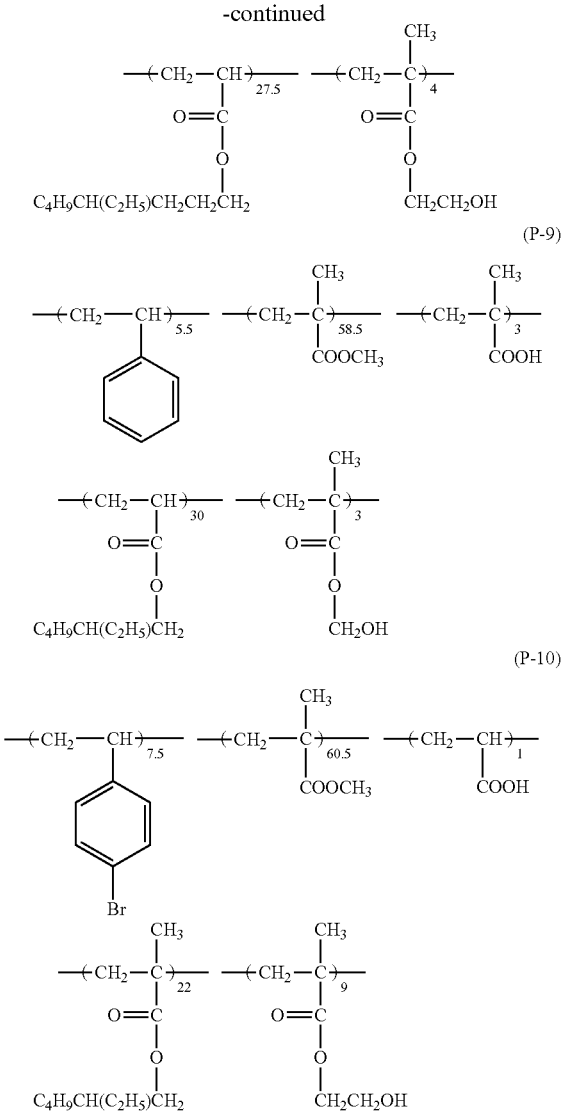

The weight average molecular weight of the polymer represented by Formula (1) is preferably 1,000 to 1,000,000, more preferably 2,000 to 750,000, and even more preferably 3,000 to 500,000.

The polymer represented by Formula (1) can be synthesized with reference to, for example, JP 3305459 B and JP 3754745 B.

(Others)

If necessary, the silver halide-containing photosensitive layer may contain other materials in addition to the aforementioned materials. Examples of other materials include metal compounds belonging to groups VIII and VIIIB such as a rhodium compound and an iridium compound that are used for stabilizing silver halide and for increasing sensitivity of silver halide. The examples also include an antistatic agent, a nucleating agent, a spectral sensitizing dye, a surfactant, an anti-fogging agent, a film hardening agent, a black spot inhibitor, a redox compound, a monomethine compound, dihydroxybenzenes, and the like described in paragraphs [0220] to [0241] of JP 2009-004348 A. Furthermore, the silver halide-containing photosensitive layer may also contain a physical development nucleus.

Particularly, the silver halide-containing photosensitive layer preferably contains a crosslinking agent used for cross-linking the aforementioned polymers to each other. If the silver halide-containing photosensitive layer contains the crosslinking agent, cross-linking proceeds between the polymers. Accordingly, even after the gelatin is decomposed and removed in the step C which will be described later, the metal silver particles in the conductive portions remain linked to each other, and consequentially, a conductive film having better conductivity is obtained.

The type of the crosslinking agent used is not particularly limited, and depending on the structure of the polymer used, an optimal crosslinking agent is appropriately selected. Generally, the crosslinking agent has at least two crosslinking groups that react with the group (reactive group) contained in the polymer.

In view of better reactivity, examples of suitable combinations of the reactive group in the polymer and the crosslinking group in the crosslinking agent include the following (1) to (8).

(1) A hydroxyl group with an isocyanate group
(2) A carboxylic acid group with an epoxy group
(3) A hydroxyl group with a carboxylic anhydride group
(4) A carboxylic acid group with an isocyanate group
(5) An amino group with an isocyanate group
(6) A hydroxyl group with an epoxy group
(7) An amino group with an epoxy group
(8) An amino group with an alkyl halide group Examples of the crosslinking agent include vinyl sulfones (for example, 1,3-bisvinylsulfonyl propane), aldehydes (for example, glyoxal), pyrimidine chlorides (for example, 2,4,6-trichloropyrimidine), triazine chlorides (for example, cyanuric chloride), an epoxy compound, a carbodimide compound, and the like. Furthermore, a crosslinking agent may be used which causes a crosslinking reaction by using a photochemical reaction induced by light irradiation.

As the epoxy compound, epoxy compounds such as 1,4-bis(2',3'-epoxypropyloxy)butane, 1,3,5-triglycidyl isocyanurate, 1,3-diglycidyl-5-(γ-acetoxy-β-oxypropyl)isocyanurate, sorbitol polyglycidyl ethers, polyglycerol polyglycidyl ethers, pentaerythritol polyglycidyl ethers, diglycerol polyglycidyl ether, 1,3,5-triglycidyl(2-hydroxyethyl)isocyanurate, glycerol polyglycerol ethers, and trimethylolpropane polyglycidyl ethers are preferable. Specific examples of commercially available products of the epoxy compounds include Denacol EX-521 or EX-614B (trade names, manufactured by Nagase Kasei Kogyo Co., Ltd.), EPOXY RESIN DY 022 (manufactured by Nagase ChemteX Corporation.), and the like, but the epoxy compound is not limited to these.

As the carbodimide compound, a compound having a plurality of carbodimide structures in a molecule is preferably used. The polycarbodimide is generally synthesized by a condensation reaction of organic diisocyanate. The organic group of the organic diisocyanate used for synthesizing the compound having a plurality of carbodimide structures in a molecule is not particularly limited. As the organic group, it is possible to use any of aromatic organic groups and aliphatic organic groups or to use a mixture of these. However, from the viewpoint of reactivity, aliphatic organic groups are particularly preferable. As the raw materials of synthesis, organic isocyanate, organic diisocyanate, organic triisocyanate, and the like are used. As the organic isocyanate, for example, aromatic isocyanate, aliphatic isocyanate, and a mixture of these can be used. Specifically, 4,4'-diphenylmethane diisocyanate, 4,4-diphenyldimethylmethane diisocyanate, 1,4-phenylene diisocyanate, 2,4-tolylene diisocyanate, 2,6-tolylene diisocyanate, hexamethylene diisocyanate, cyclohexane diisocyanate, xylylene diisocyanate, 2,2,4-trimethylhexamethylene diisocyanate, 4,4'-dicyclohexylmethane diisocyanate, 1,3-phenylene diisocyanate, and the like are used. As the organic monoisocyanate, isophorone isocyanate, phenyl isocyanate, cyclohexyl isocyanate, butyl isocyanate, naphthyl isocyanate, and the like are used. Specifically, as commercially available products of the carbodiimide-based compound, for example, Carbodilite V-02-L2 (trade name: manufactured by Nisshinbo Chemical Inc.) and the like are available.

The content of the crosslinking agent in the photosensitive layer is not particularly limited. However, in view of a better ion migration-inhibiting ability, the content of the crosslinking agent is preferably 0.02 g/m$^2$ to 3.0 g/m$^2$, and more preferably 0.05 g/m$^2$ to 2.0 g/m$^2$.

From the viewpoint of productivity, the silver halide-containing photosensitive layer preferably contains a film hardening agent that cross-links the gelatin molecules to each other.

The type of the film hardening agent is not particularly limited, and examples thereof include vinyl sulfones (for example, 1,3-bisvinylsulfonyl propane), aldehydes (for example, glyoxal), pyrimidine chlorides (for example, 2,4,6-trichloropyrimidine), triazine chlorides (for example, cyanuric chloride), an epoxy compound, a carbodimide compound, and the like.

Furthermore, the type of the film hardening agent may be the same as the type of the crosslinking agent cross-linking the aforementioned polymers to each other. That is, the film hardening agent may be a compound that crosslinks the gelatin molecules to each other while cross-linking the polymers to each other.

(Procedure of Step A)

In the step A, the method for forming the silver halide-containing photosensitive layer that contains the aforementioned components is not particularly limited. However, in view of productivity, a method is preferable in which the silver halide-containing photosensitive layer is formed on the support by bringing a composition for forming a photosensitive layer containing silver halide, gelatin, and a polymer into contact with the support.

Hereinafter, embodiments of the composition for forming a photosensitive layer used in such a method will be specifically described, and then the procedure of the step will be specifically described.

(Materials Contained in Composition for Forming Photosensitive Layer)

The composition for forming a photosensitive layer contains the aforementioned silver halide, gelatin, and polymer. Herein, the polymer may be contained in the composition for forming photosensitive layer, in the form of latex.

If necessary, the composition for forming a photosensitive layer contains a solvent.

Examples of the solvent used include water, an organic solvent (for example, alcohols such as methanol, ketones such as acetone, amides such as formamide, sulfoxides such as dimethyl sulfoxide, esters such as ethyl acetate, and ethers), ionic liquids, and a mixed solvent composed of these.

The content of the solvent used is not particularly limited. However, it is preferably within a range of 30% by mass to 90% by mass, and more preferably within a range of 50% by mass to 80% by mass, with respect to the total mass of the silver halide and the binder (the gelatin and the polymer).

The method of bringing the composition for forming a photosensitive layer into contact with the support is not particularly limited, and a known method can be used. For example, it is possible to use a method of coating the support with the composition for forming a photosensitive layer, a method of dipping the support into the composition for forming a photosensitive layer, and the like.

(Silver Halide-Containing Photosensitive Layer)

In the silver halide-containing photosensitive layer formed by the aforementioned procedure, a mass ratio (Y/X) of a mass Y of the polymer to a mass X of the gelatin is equal to or greater than 0.1. In view of better ion migration-inhibiting ability, the mass ratio (Y/X) is preferably equal to or greater than 0.2, and more preferably equal to or greater than 0.5. The upper limit thereof is not particularly limited. However, generally, the upper limit is equal to or less than 2.0 in many cases.

If the mass ratio (Y/X) is less than 0.1, the ion migration-inhibiting ability deteriorates.

The content of the silver halide in the silver halide-containing photosensitive layer is not particularly limited. However, in view of better conductivity of the thin conductive wires, the content of the silver halide is preferably 3.0 g/m$^2$ to 20.0 g/m$^2$, and more preferably 5.0 g/m$^2$ to 15.0 g/m$^2$ expressed in terms of silver.

Furthermore, the content of the polymer in the silver halide-containing photosensitive layer is not particularly limited. However, in view of better ion migration-inhibiting ability or better adhesiveness of the conductive portions, the content of the polymer is preferably 0.04 g/m$^2$ to 2.0 g/m$^2$, more preferably 0.08 g/m$^2$ to 0.4 g/m$^2$, and even more preferably 0.1 g/m$^2$ to 0.4 g/m$^2$.

[Step B (Exposure and Development Step)]

The step B is a step (exposure and development step) of forming conductive portions containing metal silver by performing exposure on the silver halide-containing photosensitive layer obtained by the step A and then performing development treatment on the silver halide-containing photosensitive layer having undergone the exposure treatment. By performing this step, the silver halide is reduced, and conductive portions containing metal silver are formed. Generally, the exposure treatment is performed patternwise, and in this way, conductive portions containing metal silver are formed in exposed portions. In contrast, in unexposed portions, the silver halide is eluted due to the development treatment which will be described later, and consequentially, non-conductive portions containing the aforementioned gelatin and polymer are formed. The non-conductive portions substantially do not contain metal silver, and refers to regions that do not exhibit conductivity.

Figure 1B:
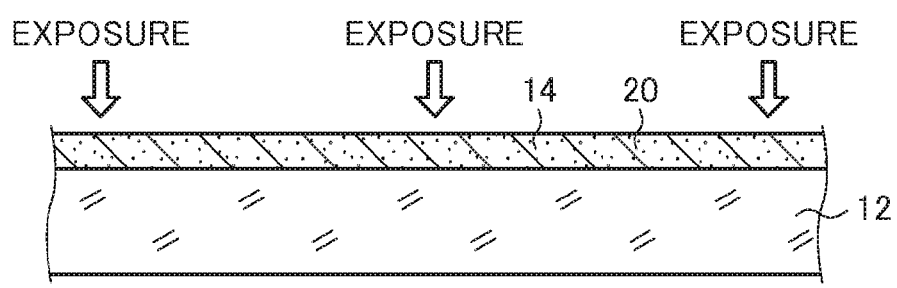
Figure 1C:
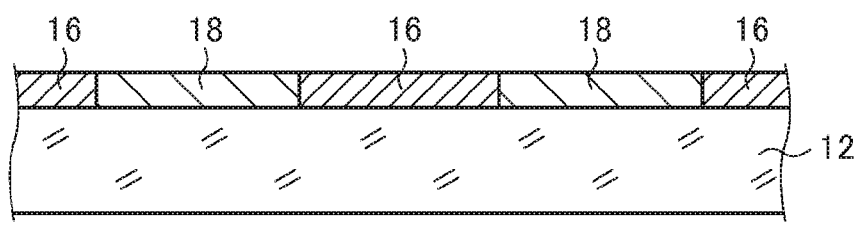

More specifically, as shown in FIG. 1B, exposure is performed on a silver halide-containing photosensitive layer 14. That is, the silver halide-containing photosensitive layer 14 is irradiated with light through a mask pattern corresponding to a predetermined exposure pattern. Alternatively, by performing digital writing exposure on the silver halide-containing photosensitive layer 14, a predetermined exposure pattern is formed in the silver halide-containing photosensitive layer 14. When receiving light energy, silver halide 20 is sensitized and generates a minute silver nucleus called a "latent image" that cannot be observed with the naked eye. Thereafter, development treatment is performed to amplify the latent image into a visualized image that can be observed with the naked eye, and as a result, as shown in FIG. 1C, conductive portions 16 and non-conductive portions 18 are formed.

Hereinafter, the exposure treatment and the development treatment performed in the present step will be specifically described.

(Exposure Treatment)

The exposure treatment is treatment for performing exposure on the photosensitive layer. By performing patternwise exposure on the photosensitive layer, the silver halide in the photosensitive layer within the exposed regions forms a latent image. Within the regions in which the latent image has been formed, the conductive portions are formed by the development treatment which will be described later. In contrast, within the unexposed regions not having undergone exposure, the silver halide is dissolved at the time of the development treatment which will be described later and flows out of the photosensitive layer, and accordingly, a transparent film (non-conductive portions) is obtained.

The light source used at the time of exposure is not particularly limited. Examples thereof include light such as visible rays and ultraviolet rays, radiation such as X-rays, and the like.

The method for performing the pattern exposure is not particularly limited. For example, the pattern exposure may be performed by either surface exposure using a photomask or scanning exposure using laser beams. Herein, the shape of the pattern is not particularly limited, and appropriately adjusted depending on the pattern of the thin conductive wires to be formed.

(Development Treatment)

The method of the development treatment is not particularly limited, and for example, it can be selected from among the following three methods depending on the type of the photosensitive layer.

(1) A method of forming metal silver by performing chemical development or thermal development on a photosensitive layer not containing a physical development nucleus (2) A method of forming metal silver by performing dissolution physical development on a photosensitive layer containing a physical development nucleus (3) A method of forming metal silver by superimposing an image receiving sheet, which has a non-photosensitive layer containing a physical development nucleus, on a photosensitive layer not containing a physical development nucleus, and performing diffusion transfer development The chemical development, thermal development, dissolution physical development, and diffusion transfer development mentioned herein have the same meaning that are generally used in the field of related art, and are explained in general photographic chemistry textbooks, for example, "Photographic Chemistry" (Shinichi Kikuchi, KYORITSU SHUPPAN CO., LTD.) and "The Theory of Photographic Process, $4^{th}$ ed." (C. E. K. Mees, Mcmillan, 1977). Furthermore, for example, the techniques described in JP 2004-184693 A, JP 2004-334077 A, JP 2005-010752 A, and the like can also be referred to.

Among the methods (1) to (3), in the method (1), the photosensitive layer having not yet been subjected to development does not have a physical development nucleus. Furthermore, the method (1) is not a diffusion transfer method using 2 sheets. Accordingly, the method (1) makes it possible to most simply and stably perform the treatment, and is preferable for manufacturing the conductive sheet of the present invention. Herein, the "dissolution physical development" is not a development method inherent in the method (2), and can be used in the method (1).

As the method of the development treatment, for example, it is possible to use the technique of general development treatment used for a silver halide photographic film, a photographic printing paper, a film for making a printing plate, an emulsion mask for a photomask, and the like.

The type of the developer used at the time of the development treatment is not particularly limited, and for example, it is possible to use a PQ developer, an MQ developer, an MAA developer, and the like. As commercially available products, for example, it is possible to use developers such as CN-16, CR-56, CP45X, FD-3, and Papitol formulated by FUJIFILM Corporation, C-41, E-6, RA-4, D-19, and D-72 formulated by KODAK, and developers included in the kit thereof. Furthermore, it is possible to use a lithographic developer.

The development treatment can include fixing treatment performed for stabilizing the photosensitive layer by removing silver halide in the unexposed portions. For the fixing treatment, it is possible to use the technologies of the fixing treatment used for a silver halide photographic film, a photographic printing paper, a film for making a printing plate, an emulsion mask for a photomask, and the like.

In the fixing treatment, the fixing temperature is preferably about 20° C. to about 50° C., and more preferably 25° C. to 45° C. The fixing time is preferably 5 seconds to 1 minute, and more preferably 7 seconds to 50 seconds.

The photosensitive layer having undergone the development and the fixing treatment is preferably subjected to washing treatment using water or to stabilization treatment. In the washing treatment using water or in the stabilization treatment, the amount of water used for washing is generally equal to or less than 20 L per 1 $m^2$ of the photosensitive material, and the amount of water replenished can be equal to or less than 3 L (the amount of water replenished may be 0, that is, the washing treatment may be performed using stored water).

The content of the metal silver contained in the exposed portions (conductive portions) having undergone the development treatment is preferably equal to or greater than 50% by mass, and more preferably equal to or greater than 80% by mass, with respect to the mass of silver contained in the exposed portions having not yet been subjected to exposure. If the content of the silver contained in the exposed portions is equal to or greater than 50% by mass with respect to the mass of the silver contained in the exposed portions having not yet been subjected to exposure, it is preferable since high conductivity can be obtained.

[Step C (Oxidant Treatment Step)]

The step C is a step (oxidant treatment step) of further treating the support having the conductive portions obtained by the step B with an oxidant decomposing the gelatin. By performing the present step, the gelatin is decomposed and removed from the photosensitive layer (so-called conductive portions and non-conductive portions) having undergone the exposure and development treatment, and thus the ion migration between the conductive portions is further inhibited.

Hereinafter, the materials used in the present step will be specifically described first, and then the procedure of the present step will be specifically described.

(Oxidant)

The oxidant used is an oxidant which has a standard electrode potential of equal to or greater than +1.5 V and decomposes the aforementioned gelatin. The gelatin is decomposed and removed by using the oxidant.

The type of the oxidant used is not particularly limited as long as the standard electrode potential thereof is equal to or greater than +1.5 V. Herein, the "standard electrode potential" means the standard electrode potential (25° C., E0) of the oxidant with respect to a standard hydrogen electrode in an aqueous solution of the oxidant.

Examples of the oxidant include persulfuric acid, percarbonic acid, perphosphoric acid, peroxoperchloric acid, peracetic acid, meta-chloroperbenzoic acid, aqueous hydrogen peroxide, perchloric acid, periodic acid, potassium permanganate, ammonium persulfate, ozone, hypochlorous acid or a salt thereof, and the like. From the viewpoint of productivity and economics, aqueous hydrogen peroxide (standard electrode potential: 1.76 V) and hypochlorous acid or a salt thereof are preferable, and sodium hypochlorite is more preferable.

(Procedure of Step)

The procedure of the step C is not particularly limited as long as the support having the conductive portions can be brought into contact with the aforementioned oxidant. Particularly, the procedure of the step C is not limited as long as the step C uses a method in which the conductive portions and the non-conductive portions on the support can be brought into contact with the oxidant. For example, it is possible to use a method of bringing a solution containing the oxidant into contact with the support having the conductive portions. Examples of the contact method include a method of coating the support having the conductive portions with a solution containing the oxidant, a method of dipping the support having the conductive portions into a solution containing the oxidant, and the like. The type of the solvent contained in the solution is not particularly limited, and examples of the solvent include water and known organic solvents.

The contact time is not particularly limited, and in view of better ion migration-inhibiting ability of the conductive sheet, the contact time is preferably 10 seconds to 500 seconds, and more preferably 90 seconds to 360 seconds.

[Preferred Embodiments of Manufacturing Method of Conductive Sheet]

The manufacturing method of a conductive sheet of the present invention may include other steps in addition to the aforementioned steps A to C.

Hereinafter, optional steps will be specifically described.

(Step D (Silver Halide-Free Layer-Forming Step))

The manufacturing method of the present invention preferably further includes, before the step A, a step D of forming a silver halide-free layer, which contains gelatin and a polymer different from the gelatin, on the support. By performing the present step, the silver halide-free layer is formed between the support and the silver halide-containing photosensitive layer formed by the step A. The silver halide-free layer plays a role of a so-called anti-halation layer and makes a contribution to the improvement of adhesiveness between the conductive portions and the support. Furthermore, the silver halide-free layer also functions as a lower layer in the conductive portions which will be described later.

The silver halide-free layer contains the aforementioned gelatin and polymer, but does not contain silver halide.

The mass ratio (the mass of the polymer/the mass of the gelatin) of the polymer to the gelatin in the silver halide-free layer is not particularly limited. However, in view of better ion migration-inhibiting ability, the mass ratio is preferably 0.1 to 5.0, and more preferably 1.0 to 3.0.

The content of the polymer in the silver halide-free layer is not particularly limited. However, in view of better ion migration-inhibiting ability, the content of the polymer is preferably 0.03 g/m$^2$ to 1.63 g/m$^2$, and more preferably 0.325 g/m$^2$ to 0.975 g/m$^2$. Particularly, in view of excellent surface quality at the time of oxidation treatment, the content of the polymer is more preferably 0.50 g/m$^2$ to 0.975 g/m$^2$.

If necessary, the silver halide-free layer may contain other materials in addition to the aforementioned materials. Examples of other materials include the aforementioned other materials (for example, an antistatic agent, a surfactant, an anti-fogging agent, a film hardening agent, and a black spot inhibitor) that may be contained in the silver halide-containing photosensitive layer.

Moreover, as with the silver halide-containing photosensitive layer, the silver halide-free layer preferably contains a crosslinking agent used for cross-linking the polymers to each other. If the silver halide-free layer contains the crosslinking agent, crosslinking proceeds between the polymers. Accordingly, even after the gelatin is decomposed and removed in the step C, the metal silver particles in the conductive portions remain linked to each other, and consequentially, a conductive film having better conductivity is obtained. The type of the crosslinking agent is as described above.

Furthermore, as with the silver halide-containing photosensitive layer, from the viewpoint of productivity, the silver halide-free layer preferably contains a film hardening agent cross-linking the gelatin molecules to each other. The type of the film hardening agent is as described above.

The method for forming the silver halide-free layer is not particularly limited, and examples thereof include a method of coating the support with a composition for forming a layer containing gelatin and a polymer, and performing heating treatment, if necessary.

If necessary, the composition for forming a layer may contain a solvent. As the type of the solvent, the aforementioned solvents used in the composition for forming a photosensitive layer are exemplified.

The thickness of the silver halide-free layer is not particularly limited, but generally, the thickness is preferably 0.05 µm to 2.0 µm, and more preferably 0.65 µm to 1.5 µm.

(Step E (Protective Layer-Forming Step))

The manufacturing method of the present invention preferably further includes, between the step A and the step B, a step E of forming a protective layer, which contains gelatin and a polymer different from the gelatin, on the silver halide-containing photosensitive layer. If the protective layer is formed, it is possible to prevent scratches of the photosensitive layer or to improve dynamic characteristics of the photosensitive layer. The protective layer also functions as an upper layer in the conductive portions which will be described later.

The mass ratio (the mass of the polymer/the mass of the gelatin) of the polymer to the gelatin in the protective layer is not particularly limited. However, in view of better ion migration-inhibiting ability, the mass ratio is preferably greater than 0 and equal to or less than 2.0, more preferably greater than 0 and equal to or less than 1.0, and even more preferably 0.05 to 0.075.

The content of the polymer in the protective layer is not particularly limited. However, in view of better ion migration-inhibiting ability, the content of the polymer is preferably greater than 0 g/m$^2$ and equal to or less than 0.3 g/m$^2$, and more preferably 0.075 g/m$^2$ to 0.01 g/m$^2$.

The method for forming a protective film is not particularly limited, and examples thereof include a method of coating the photosensitive layer with a composition for forming a protective layer containing gelatin and a polymer, and performing heating treatment, if necessary.

If necessary, the composition for forming a protective layer may contain a solvent. As the type of the solvent, the solvents used in the aforementioned composition for forming a photosensitive layer are exemplified.

The thickness of the protective layer is not particularly limited. However, generally, it is preferably 0.03 µm to 0.3 µm, and more preferably 0.075 µm to 0.20 µm.

If necessary, the protective layer may contain other materials in addition to the aforementioned materials. Examples of other materials include the aforementioned other materials (for example, an antistatic agent, a surfactant, an anti-fogging agent, a film hardening agent, and a black spot inhibitor) that may be contained in the silver halide-containing photosensitive layer.

Moreover, as with the silver halide-containing photosensitive layer, the protective layer preferably contains a crosslinking agent used for cross-linking the polymers to each other. If the protective layer contains the crosslinking agent, crosslinking proceeds between the polymers. Accordingly, even after the gelatin is decomposed and removed in the step C, the metal silver particles in the conductive portions remain linked to each other, and consequentially, a conductive film having better conductivity is obtained. The type of the crosslinking agent is as described above.

Furthermore, as with the silver halide-containing photosensitive layer, from the viewpoint of productivity, the protective layer preferably contains a film hardening agent cross-linking the gelatin molecules to each other. The type of the film hardening agent is as described above.

(Step F (Reduction Step))

The manufacturing method of the present invention preferably further includes, between the steps B and C and/or after the step C, a step F of performing reduction treatment by treating the support having the conductive portions with a reducing aqueous solution. The technique of intensification described in "Intensification, Reduction, Toning, and other treatment" on page 22 of "Chemistry of Photography" (Akira Sasai, Shashin Kogyo Shuppansha) can be referred to. By oxidating silver generated by the development treatment once and then performing reduction treatment again, a conductive sheet having higher conductivity can be obtained.

The type of the reducing aqueous solution is not particularly limited as long as reduction of silver can proceed. For example, it is possible to use a sodium sulfite aqueous solution, a hydroquinone aqueous solution, a paraphenylenediamine aqueous solution, an oxalic acid aqueous solution, an ascorbic acid aqueous solution, a sodium borohydride aqueous solution, and the like. The pH of these aqueous solutions is preferably equal to or higher than 10.

The treatment method is not particularly limited as long as the support having the conductive portions is brought into contact with the reducing aqueous solution. Examples of the contact method include a method of dipping the support into the reducing aqueous solution.

(Step G (Light Irradiation Step))

The manufacturing method of the present invention preferably further includes, between the steps B and C and/or after the step C, a step G of irradiating the conductive portions with pulsed light from a xenon flash lamp. By performing the present step, the resistance of the conductive portions can be reduced. The reason why the conductivity of the conductive sheet is improved is indefinite. However, it is considered that by irradiating the conductive portions with pulsed light from a xenon flash lamp, at least either or both of the polymer and the gelatin may partially evaporate due to heat, and thus metal atoms (conductive substances) may easily bind to each other.

The irradiation amount of the pulsed light is not particularly limited. However, it is preferably equal to or less than 1,500 J, more preferably 1 J to 1,500 J, even more preferably 100 J to 1,000 J, and particularly preferably 500 J to 800 J, per pulse. The irradiation amount can be measured by using a general ultraviolet illuminometer. As the general ultraviolet illuminometer, for example, an illuminometer having a detection peak at 300 nm to 400 nm can be used.

For example, when the conductive sheet is used as an electrode for a touch panel, in order to prevent the conductive portions from becoming visible to the naked eye, the line width of the conductive portions is preferably 1 μm to 15 μm, and the thickness thereof is preferably 1 μm to 3 μm. When the line width and the thickness are within the above range, the number of times of radiating the pulsed light is preferably equal to or greater than 1 and equal to or less than 2,000, more preferably equal to or greater than 1 and equal to or less than 50, and even more preferably equal to or greater than 1 and equal to or less than 30.

(Step H (Smoothing Step))

The manufacturing method of the present invention preferably further includes, between the steps B and C and/or after the step C, a step H of performing smoothing treatment on the conductive portions. By performing the present step, the conductivity and the adhesiveness of the conductive portions are improved, and the surface resistance is reduced.

The method of the smoothing treatment is not particularly limited. For example, the treatment can be performed by using calender rolls. Generally, the calender rolls are composed of a pair of rolls. Hereinafter, the smoothing treatment using the calender rolls is described as calender treatment.

As the rolls used in the calender treatment, plastic rolls of epoxy, polyimide, polyamide, polyimide amide, and the like or metal rolls are used. Particularly, when the support has the photosensitive layer on both surfaces thereof, the treatment is preferably performed by using metal rolls. When the support has the photosensitive layer on one surface thereof, for preventing wrinkling, a metal roll and the plastic roll may be used in combination. The lower limit of the linear pressure is preferably equal to or greater than 196 N/cm (20 kg/cm), and more preferably equal to or greater than 1,960 N/cm (200 kg/cm). The upper limit of the linear pressure is preferably equal to or less than 6,860 N/cm (700 kgf/cm). Herein, the linear pressure (load) is a force applied per 1 cm of a film sample subjected to consolidation treatment.

In view of better visibility of the conductive portions, the surface roughness Ra of the rolls used in the calender treatment is preferably 0 μm to 2.0 μm, and more preferably 0.3 μm to 1.0 μm.

The temperature applied at the time of the smoothing treatment represented by the calender rolls is preferably 10° C. (unregulated) to 100° C. The temperature is more preferably within a range of about 10° C. (unregulated) to 50° C., although it varies with the scanning density or the shape of the pattern of the conductive portions or with the type of the binder.

(Step I (Heating Step))

The manufacturing method of the present invention preferably further includes, between the steps B and C and/or after the step C, a step I of performing heating treatment on the support having the conductive portions. By performing the present step, the conductivity of the conductive portions is improved, and a conductive sheet having better ion migration-inhibiting ability is obtained. Furthermore, by performing the present step, the haze of the conductive sheet is reduced, the adhesiveness of the conductive portions is improved, the surface quality at the time of the oxidation treatment is improved, and the surface resistance is reduced.

As one of the examples of the method of the heating treatment, there is treatment of bringing the support having the conductive portions into contact with superheated vapor.

The superheated vapor may be superheated water vapor or a mixture of superheated water vapor and other gases.

The superheated vapor is preferably brought into contact with the conductive portions for a supply time within a range of equal to or longer than 10 seconds and equal to or less than 70 seconds. If the supply time is less than 10 seconds, the effect of improving the conductivity cannot be expected much. Therefore, the supply time is equal to or longer than 10 seconds. Moreover, because the conductivity is not improved any further from around 70 seconds, it is useless to set the supply time to be longer than 70 seconds.

It is desirable that the superheated vapor be brought into contact with the conductive portions in a supply amount within a range of 500 g/m$^3$ to 600 g/m$^3$. Moreover, it is preferable that the temperature of the superheated vapor is controlled to be equal to or higher than 100° C. and equal to or less than 160° C. at 1 atm.

As another method of the heating treatment, for example, there is heating treatment performed at a heating temperature of 80° C. to 150° C.

The heating time is not particularly limited. However, in view of making the aforementioned effect better, it is preferably 0.1 hours to 5.0 hours, and more preferably 0.5 hours to 1.0 hour.

(Step J (Stabilization Step))

The manufacturing method of the present invention preferably further includes, after the step C, a step J of bringing the support having the conductive portions into contact with a migration inhibitor. By performing the present step, the metal silver in the conductive portions is stabilized, and thus ion migration is sufficiently inhibited even if the time taken for the gelatin decomposition treatment performed by the aforementioned oxidant is shortened.

As the migration inhibitor used, known materials can be used. For example, a nitrogen-containing heterocyclic compound or an organic mercapto compound is preferable, and among these, a nitrogen-containing heterocyclic compound is preferably used.

Preferable examples of the nitrogen-containing heterocyclic compound include 5- or 6-membered cyclic azoles, and among these, 5-membered azoles are preferable.

Examples of the heterocyclic ring include a tetrazole ring, a triazole ring, an imidazole ring, a thiadiazole ring, an oxadiazole ring, a selenadiazole ring, an oxazole ring, a thiazole ring, a benzoxazole ring, a benzothiazole ring, a benzimidazole ring, a pyrimidine ring, a triazaindene ring, a tetraazaindene ring, a pentaazaindene ring, and the like.

These rings may have a substituent, and examples of the substituent includes a nitro group, a halogen atom (for example, a chlorine atom or a bromine atom), a mercapto group, a cyano group, a substituted or unsubstituted alkyl group (for example, a group of methyl, ethyl, propyl, t-butyl, or cyanoethyl), an aryl group (for example, a group of phenyl, 4-methanesulfonamide phenyl, 4-methylphenyl, 3,4-dichlorophenyl, or naphthyl), an alkenyl group (for example, an allyl group), an aralkyl group (for example, a group of benzyl, 4-methylbenzyl, or phenethyl), a sulfonyl group (for example, a group of methanesulfonyl, ethanesulfonyl, or p-toluenesulfonyl), a carbamoyl group (for example, a group of unsubstituted carbamoyl, methyl carbamoyl, or phenyl carbamoyl), a sulfamoyl group (for example, a group of unsubstituted sulfamoyl, methyl sulfamoyl, or phenyl sulfamoyl), a carbonamide group (for example, a group of acetamide or benzamide), a sulfonamide group (for example, a group of methane sulfonamide, benzene sulfonamide, or p-toluene sulfonamide), an acyloxy group (for example, a group of acetyloxy or benzoyloxy), a sulfonyloxy group (for example, methane sulfonyloxy), a ureide group (for example, a group of unsubstituted ureide, methyl ureide, ethyl ureide, or phenyl ureide), an acyl group (for example, a group of acetyl or benzoyl), an oxycarbonyl group (for example, a group of methoxycarbonyl or phenoxycarbonyl), an oxycarbonylamino group (for example, a group of methoxycarbonylamino, phenoxycarbonylamino, or 2-ethylhexyloxycarbonylamino), a hydroxyl group, and the like. A single ring may be substituted with a plurality of substituents.

Preferable examples of the nitrogen-containing heterocyclic compound specifically include imidazole, benzimidazole, benzindazole, benzotriazole, benzoxazole, benzothiazole, pyridine, quinoline, pyrimidine, piperidine, piperazine, quinoxaline, morpholine, and the like. These may have a substituent such as an alkyl group, a carboxyl group, a sulfo group, or the like.

As the nitrogen-containing 6-membered cyclic compound, compounds having a triazine ring, a pyrimidine ring, a pyridine ring, a pyrroline ring, a piperidine ring, a pyridazine ring, or a pirazine ring are preferable. Among these, compounds having a triazine ring or a pyrimidine ring are preferable. These nitrogen-containing 6-membered cyclic compounds may have a substituent, and in this case, examples of the substituent include a lower alkyl group having 1 to 6 carbon atoms and more preferably having 1 to 3 carbon atoms, a lower alkoxy group having 1 to 6 carbon atoms and more preferably having 1 to 3 carbon atoms, a hydroxyl group, a carboxyl group, a mercapto group, an alkoxyalkyl group having 1 to 6 carbon atoms and more preferably having 1 to 3 carbon atoms, and a hydroxyalkyl group having 1 to 6 carbon atoms and more preferably having 1 to 3 carbon atoms.

Preferable examples of the nitrogen-containing 6-membered cyclic compound specifically include triazine, methyl triazine, dimethyl triazine, a hydroxyethyl triazine ring, pyrimidine, 4-methylpyrimidine, pyridine, and pyrroline.

Examples of the organic mercapto compound include an alkyl mercapto compound, an aryl mercapto compound, a heterocyclic mercapto compound, and the like.

Examples of the alkyl mercapto compound include cysteine, thiomalic acid, and the like. Examples of the aryl mercapto compound include thiosalicylic acid and the like. Examples of the heterocyclic mercapto compound include 2-phenyl-1-mercapto tetrazole, 2-mercaptobenzimidazole, 2-mercaptobenzothiazole, 2-mercaptobenzoxazole, 2-mercaptopyrimidine, 2,4-dimercaptopyrimidine, 2-mercaptopyridine, and the like. The aforementioned organic mercapto compounds may have a substituent such as an alkyl group, a carboxyl group, a sulfo group, or the like.

The method of bringing the support having the conductive portions into contact with the migration inhibitor is not particularly limited. Examples of the method include a method of coating the support with the migration inhibitor, a method of dipping the support having the conductive portions into the migration inhibitor, and the like.

If necessary, a solution obtained by dissolving the migration inhibitor in a solvent may be used. The type of the solvent used is not particularly limited, and examples of the solvent include the aforementioned solvents used in the composition for forming a photosensitive layer.

The contact time is not particularly limited. However, it is preferably 0.5 minutes to 10 minutes, and more preferably 1.0 minute to 3.0 minutes.

(Step K (Organic Solvent Contact Step))

The manufacturing method of the present invention preferably further includes, after the step C, a step K of bringing the support having the conductive portions into contact with an organic solvent. By performing the present step, the film of the polymer remaining in the conductive portions or in the non-conductive portions becomes denser. Consequentially, a conductive sheet having a better ion migration-inhibiting ability is obtained, and the value of haze of the conductive sheet can be reduced.

The type of the organic solvent used is not particularly limited, and depending on the type of the polymer, an optimal solvent is appropriately selected. Particularly, in view of making the aforementioned effect better, an organic solvent dissolving the polymer is preferable. Herein, "dissolving"

means that 1 L of the organic solvent dissolves the polymer in an amount of at least equal to or greater than 5 g.

Particularly, an organic solvent having an SP value within a range of 8 to 12 is preferable.

Specific examples of the organic solvent include benzyl alcohol, toluene, methyl ethyl ketone, acetone, ethyl acetate, and the like.

The method of bringing the support having the conductive portions into contact with the organic solvent is not particularly limited, and a known method can be adopted. Examples of the method include a method of coating the support with the organic solvent, a method of dipping the support having the conductive portions into the organic solvent, and the like.

The contact time of the organic solvent is not particularly limited. However, it is preferably 10 minutes to 60 minutes, and more preferably 15 minutes to 30 minutes.

(Other Optional Steps)

After the step C, in order to improve the conductivity of the conductive portions, either or both of physical development and plating treatment for causing conductive metal particles to be supported on the conductive portions may be performed. In the present invention, one of the physical development and the plating treatment may be performed to cause the conductive metal particles to be supported on the conductive portions. Alternatively, the physical development and the plating treatment may be performed in combination so as to cause the conductive metal particles to be supported on the conductive portions.

In the present embodiment, "physical development" means a process of reducing a metal ion such as silver ion by using a reductant and thus depositing the metal particles on a nucleus of metal or a metal compound. The physical development is used for manufacturing an instant B&W film, an instant slide film, a printing plate, and the like, and the technique thereof can be used in the present invention.

In the present embodiment, the plating treatment can be performed by using electroless plating (chemical reduction plating or displacement plating). In the present embodiment, the electroless plating can be performed by using a known electroless plating technique. For example, an electroless plating technique used for a printed wiring board or the like can be used. The electroless plating is preferably electroless copper plating.

[Conductive Sheet]

The conductive sheet obtained through the aforementioned steps has at least a support and conductive portions.

When the conductive portions are in the form of lines (when the conductive portions are composed of thin conductive wires), the line width is not particularly limited. However, the line width is preferably equal to or less than 30 µm, more preferably equal to or less than 15 µm, even more preferably equal to or less than 10 µm, particularly preferably equal to or less than 9 µm, and most preferably equal to or less than 7 µm. Furthermore, the line width is preferably equal to or greater than 0.5 µm, and more preferably equal to or greater than 1.0 µm. Within the above range, an electrode with low resistance can be relatively easily formed.

The thickness of the thin conductive wires is not particularly limited. However, it is preferably 0.001 mm to 0.2 mm, more preferably equal to or less than 30 µm, even more preferably equal to or less than 20 µm, particularly preferably 0.01 µm to 9 µm, and most preferably 0.05 µm to 5 µm. Within the above range, an electrode with low resistance having excellent durability can be relatively easily formed.

The pattern formed of the thin conductive wires is not particularly limited. When the conductive sheet is applied to a touch panel, and a sensor electrode is formed of the thin conductive wires, for example, an embodiment is preferable in which the pattern includes a plurality of lattices (for example, polygonal lattices having a triangular shape, a quadrangular shape (square shape), a hexagonal shape, or the like) constituted with thin conductive wires crossing each other.

The line interval (herein, the interval between the sides of lattices that face each other) is preferably 30 µm to 500 µm, more preferably 50 µm to 400 µm, and particularly preferably 100 µm to 350 µm.

In view of visible light transmittance, the opening ratio of the conductive pattern formed of the thin conductive wires is preferably equal to or greater than 85%, more preferably equal to or greater than 90%, and most preferably equal to or greater than 95%. The opening ratio corresponds to a proportion of a light transmitting portion in a predetermined region excluding the thin conductive wires.

Generally, the aforementioned exposure is performed patternwise, and the unexposed portions form the non-conductive portions. The silver halide and the gelatin contained in the unexposed portions are removed by the steps B and C. As a result, the non-conductive portions having undergone the step C contain the polymer. That is, the non-conductive portions contain the polymer as a main component.

The transmittance in the non-conductive portions that is determined excluding the contribution of the light absorption and reflection of the support and represented by the minimum value of transmittance in a wavelength region of 380 nm to 780 nm is preferably equal to or greater than 90%, more preferably equal to or greater than 95%, even more preferably equal to or greater than 97%, particularly preferably equal to or greater than 98%, and most preferably equal to or greater than 99%.

One of the preferred embodiments of the conductive sheet is, for example, a conductive sheet having a support, conductive portions which are disposed on the support and contain metal silver and a resin binder, and resin binder portions each of which is present between the conductive portions. Each of the conductive portions has a lower layer free of (not containing) metal silver, an intermediate layer containing metal silver, and a upper layer free of (not containing) metal silver, in this order. The average thickness of the upper layer is equal to or less than 0.40 µm, and a hydrophobization rate A of the conductive sheet determined by the method which will be described later is equal to or greater than 90. According to this embodiment, the occurrence of ion migration between the conductive portions is further inhibited, and the contact resistance with respect to the conductive portions is reduced. Therefore, conductive sheet can be suitably applied to a touch panel and the like.

Figure 3:
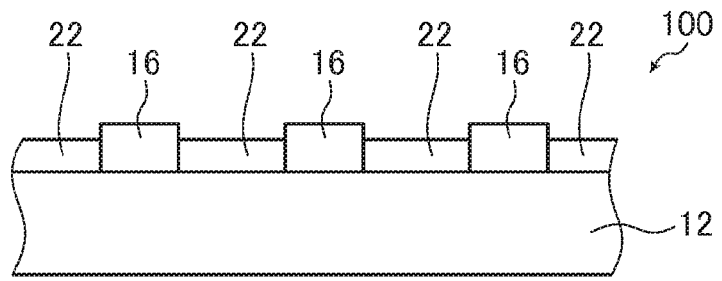
FIG. 3 is a cross-sectional view of a preferred embodiment of the conductive sheet of the present invention.
Figure 4:
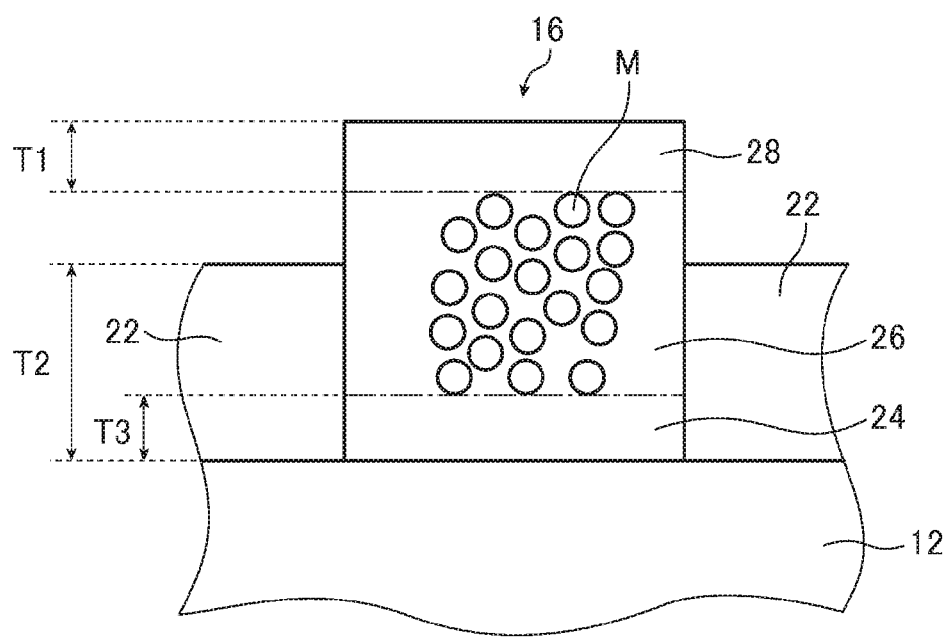
FIG. 4 is an enlarged cross-sectional view of the preferred embodiment of the conductive sheet of the present invention.

The aforementioned preferred embodiment will be specifically described by using FIGS. 3 and 4.

As shown in FIG. 3, a conductive sheet 100 has a support 12, conductive portions 16 disposed on the support 12, and resin binder portions 22 each of which is disposed between the conductive portions 16. The resin binder portions 22 correspond to the aforementioned non-conductive portions.

Hereinafter, the constitution of the respective components will be specifically described.

The definition of the support 12 is as described above.

As described above, the conductive portions 16 are members that contain metal silver and a resin binder and function as conductive paths in the conductive sheet. As the preferred range of the line width, thickness, and the like of the conductive portions 16, the line width and thickness of the aforementioned thin conductive wire are exemplified.

FIG. 4 is an enlarged cross-sectional view of one conductive portion 16. Each of the conductive portions 16 is constituted with a three-layer structure composed of a lower layer 24 not containing metal silver M, an intermediate layer 26 containing the metal silver M, and an upper layer 28 not containing the metal silver M. The lower layer 24 and the upper layer 28 contain a resin binder but do not contain the metal silver M. In contrast, the intermediate layer 26 contains both the metal silver M and the resin binder. FIG. 4 shows an embodiment in which the metal silver M is present in the intermediate layer 26 in a state of being dispersed in the form of particles. However, the metal silver M is not limited to this embodiment, and may be present in the form of a lump.

Because of the presence of the lower layer 24, the adhesiveness between the conductive portion 16 and the support 12 is secured. Moreover, because of the presence of the upper layer 28, the metal silver M that functions as the conductive path in the conductive portion 16 can be protected from the external shocks (scratch and the like).

The resin binder will be specifically described later.

An average thickness T1 of the upper layer 28 is equal to or less than 0.4 μm. In order to further reduce the contact resistance, the average thickness T1 is preferably equal to or less than 0.20 μm, and more preferably equal to or less than 0.05 μm. The lower limit thereof is not particularly limited. However, in view of causing the upper layer 28 to sufficiently function as a protective layer, the lower limit is preferably equal to or greater than 0.02 μm.

If the average thickness T1 of the upper layer 28 exceeds 0.4 μm, the value of contact resistance with respect to the conductive portion 16 greatly increases. Consequentially, when the conductive sheet is applied to a touch panel and the like, electricity does not easily flow to the conductive portions.

In order to determine the average thickness T1 of the upper layer 28, the vertical cross-section of the conductive portion 16 is observed with a microscope, and from 10 random points of the surface of the conductive portion 16 on the air side, vertical lines are drawn toward the side of the support 12. Then, the lengths of the lines reaching the metal silver M are measured respectively, and the arithmetic mean thereof is calculated and taken as the average thickness T1. That is, the average thickness T1 of the upper layer 28 means the average length of the vertical lines that are drawn toward the side of the support 12 from the surface of the conductive portion 16 (the surface on the side opposite to the side of the support 12) and reach the metal silver in the vertical cross-sectional view of the conductive portion 16. Herein, if a vertical line is drawn, and it reaches the support 12 without reaching the metal silver M, the length thereof is not included in the values for calculating the average thickness T1.

The resin binder portions 22 are members inhibiting the occurrence of ion migration between the conductive portions 16, and do not function as conductive paths.

The resin binder portions 22 contain a resin binder. The resin binder is not particularly limited as long as it is a resin binder satisfying the hydrophobization rate A which will be described later. Examples of the resin binder include polymers different from the aforementioned gelatin.

The resin binder portions 22 substantially do not contain metal silver. The term "substantially" means that the content of the metal silver in the resin binder portions is equal to or less than 0.1% by mass.

As shown in FIG. 3, in the conductive sheet 100, the thickness of the conductive portions 16 is generally greater than the thickness of the resin binder portions 22. However, the present invention is not limited to such an embodiment.

The hydrophobization rate A of the conductive sheet is equal to or greater than 90.0. In view of further inhibiting the occurrence of ion migration between the conductive portions, the hydrophobization rate A is preferably equal to or greater than 95.0, and more preferably equal to or greater than 99.0. The upper limit thereof is 100, although it is not particularly limited.

When the hydrophobization rate is less than 90.0, the occurrence of ion migration between the conductive portions is not sufficiently inhibited.

At the time of evaluating the hydrophobization rate A, the conductive sheet is dipped into a sodium hypochlorite solution. By dipping the conductive sheet into the sodium hypochlorite solution, a hydrophilic component (for example, gelatin) or the like contained in the conductive sheet is decomposed and removed. That is, the hydrophobization rate A is a numerical value relating to the amount of the hydrophilic component contained in the conductive sheet. When the hydrophobization rate A is high, it means that the amount of the hydrophilic component contained in the conductive sheet is small.

Hereinafter, the method for measuring the hydrophobization rate A (hydrophobization rate A-measuring method) will be specifically described.

First, the conductive sheet, which has not yet been subjected to the dipping treatment which will be described later, is subjected to drying treatment for 24 hours at 110° C. Thereafter, the mass (mass X (g) before dipping treatment) of the conductive sheet is measured.

Thereafter, the conductive sheet is dipped into a sodium hypochlorite solution (25° C.) having an effective chlorine concentration of 5% for 10 minutes and then subjected to washing treatment (for 5 minutes) using water (20° C.).

The conductive sheet is then subjected to drying treatment for 24 hours at 110° C., and subsequently, the mass (mass Y (g) after dipping treatment) of the conductive sheet is measured.

Then, by using a mass Z (g) of the support in the conductive sheet, the hydrophobization rate is calculated by the following Equation (A). A hydrophobization rate A1 represents a ratio of increase and decrease of mass in a portion other than the support in the conductive sheet. The mass Z of the support is determined by being separately measured from only the support.

$$\text{Hydrophobization rate } A1 = [\text{mass } Y - \text{mass } Z]/[\text{mass } X - \text{mass } Z] \times 100 \qquad \text{Equation (A):}$$

Five conductive sheets are prepared, the hydrophobization rate A1 is calculated for each of them, and the arithmetic mean thereof is calculated. In this way, the hydrophobization rate A is determined.

As one of the preferred embodiments of the conductive sheet, a conductive sheet having a hydrophobization rate B, which will be described later, of equal to or greater than 90.0 is preferable. The hydrophobization rate B is more preferably equal to or greater than 95.0, and even more preferably equal to or greater than 99.0. The upper limit thereof is 100, although it is not particularly limited. If the hydrophobization rate B is equal to or greater than 90.0, the occurrence of ion migration between the conductive portions is further inhibited.

At the time of evaluating the hydrophobization rate B, the conductive sheet is dipped into hot water. By dipping the conductive sheet into the hot water, a hydrophilic component (for example, gelatin) or the like contained in the conductive sheet is decomposed and removed. That is, the hydrophobization rate B is a numerical value relating to the amount of the hydrophilic component contained in the conductive sheet. When the hydrophobization rate B is high, it means that the amount of the hydrophilic component contained in the conductive sheet is small.

Hereinafter, the method for measuring the hydrophobization rate B (hydrophobization rate B-measuring method) will be specifically described.

First, the conductive sheet, which has not yet been subjected to the dipping treatment which will be described later, is subjected to drying treatment for 24 hours at 110° C. Thereafter, the mass (mass M (g) before dipping treatment) of the conductive sheet is measured.

Thereafter, the conductive sheet is dipped into hot water (70° C.) for 1 hour.

The conductive sheet is then subjected to drying treatment for 24 hours at 110° C., and subsequently, the mass (mass N (g) after dipping treatment) of the conductive sheet is measured.

Then, by using the mass Z (g) of the support in the conductive sheet, the hydrophobization rate is calculated by the following Equation (B). A hydrophobization rate B1 represents a ratio of increase and decrease of mass in a portion other than the support in the conductive sheet.

$$\text{Hydrophobization rate } B1 = [\text{mass } N - \text{mass } Z]/[\text{mass } M - \text{mass } Z] \times 100 \qquad \text{Equation (B):}$$

Five conductive sheets are prepared, the hydrophobization rate B1 is calculated for each of them, and the arithmetic mean thereof is calculated. In this way, the hydrophobization rate B is determined.

As another preferred embodiment of the conductive sheet, a difference (T2−T3) between an average thickness T2 of the resin binder portions 22 and an average thickness T3 of the lower layer 24 is preferably greater than 0.02 µm. The difference (T2 −T3) is more preferably equal to or greater than 0.1 µm, and even more preferably greater than 0.3 µm. Generally, the upper limit thereof is equal to or less than 10 µm in many cases, although it is not particularly limited. Within the above range, even when the side of the conductive portions 16 of the conductive sheet is scratched, wires in the conductive portions 16 are not easily broken. More specifically, within the aforementioned numerical range, the metal silver M is present in a position deep inside the conductive portion 16 (side of the support 12) relative to the surface position of the resin binder portion 22. Therefore, even when the surface portion of the conductive portion 16 is scratched, and the metal silver M is partially removed, the metal silver M remains in the conductive portion 16, and accordingly, the wires are not easily broken.

In order to determine the average thickness of the resin binder portions 22, the vertical cross-section of the resin binder portions is observed with a microscope, and the thicknesses of the resin binder portions 22 are measured in 10 random points. The average thickness is a value obtained by calculating the arithmetic mean thereof. Furthermore, in order to determine the average thickness T3 of the lower layer 24, the vertical cross-section of the conductive portion 16 is observed with a microscope, and lengths from 10 random points of the surface of the support 12 to the metal silver M in a normal line direction with respect to the support 12 are measured. The average thickness T3 is a value obtained by calculating the arithmetic mean thereof. That is, in order to determine the average thickness T3 of the lower layer 24, in the vertical cross-sectional view of the conductive portion 16, vertical lines are drawn from the surface of the conductive portion 16 on the side of the support 12 to the side opposite to the side of the support 12, and at this time, the average length of the vertical lines reaching the metal silver refers to the average thickness T3. Herein, if a vertical line reaches the surface of the conductive portion 16 on the air side without reaching the metal silver M, the length thereof is not included in the values for calculating the average thickness T3.

Examples of manufacturing methods of the above preferred embodiments of the conductive sheet include the aforementioned manufacturing methods of a conductive sheet. Particularly, an embodiment is preferable in which at least the step D (silver halide-free layer-forming step) and the step E (protective layer-forming step) are performed together with the steps A to C; an embodiment is more preferable in which at least the step F (reduction step) and the step H (smoothing step) are performed together with the steps A to E; and an embodiment is even more preferable in which at least the step I (heating step), the step J (stabilization step), and the step K (organic solvent contact step) are performed together with the steps A to E, F, and H.

The conductive sheet of the present invention can be used for various purposes. For example, it can be used as various electrodes (for example, an electrode for a touch panel, an electrode for an inorganic EL element, an electrode for an organic EL element, and an electrode for a solar cell), a heating sheet, or a printed wiring board. The conductive sheet is preferably used in a touch panel, and particularly preferably used in a capacitance-type touch panel.

Furthermore, the conductive sheet of the present invention can also be used as an electromagnetic wave shield which shields electromagnetic waves such as radio waves or microwaves (ultrahigh frequency waves) generated from a personal computer, a work station, and the like, and also prevents static electricity. In addition to the electromagnetic wave shield used in the mainframe of a personal computer, the conductive sheet can also be used as an electromagnetic wave shield used in an image capturing device, an electronic medical device, or the like.

Moreover, the conductive sheet of the present invention can be used as a transparent heating element.

EXAMPLES

Hereinafter, the present invention will be more specifically described based on examples. The materials, the amount of the materials used, the ratio of the materials, the content of treatment, the procedure of treatment, and the like, that are shown in the following examples, can be appropriately changed within a range that does not depart from the gist of the present invention. Accordingly, the scope of the present invention is not limited to the following specific examples.

Example 1

Preparation of Silver Halide Emulsion

To the following liquid 1 held at 38° C. and pH 4.5, the following liquid 2 and liquid 3 were simultaneously added for 20 minutes while being stirred, thereby forming nuclear particles having a particle size of 0.16 µm. At this time, each of the liquid 2 and liquid 3 was used in an amount corresponding to 90% of the amount thereof. Thereafter, the following liquid 4 and liquid 5 were added thereto for 8 minutes. Then, the balance of 10% of the following liquid 2 and liquid 3 was added thereto for 2 minutes, and particles were allowed to grow up to 0.21 µm. Moreover, 0.15 g of potassium iodide was added thereto, the resultant was aged for 5 minutes, and then the formation of particles was ended.

Liquid 1:

| Water | 750 ml |
|---|---|
| Gelatin | 8.6 g |
| Sodium chloride | 3 g |
| 1,3-Dimethylimidazolidine-2-thione | 20 mg |
| Sodium benzene thiosulfonate | 10 mg |
| Citric acid | 0.7 g |

Liquid 1:

| Water | 300 ml |
|---|---|
| Silver nitrate | 150 g |

Liquid 3:

| Water | 300 ml |
|---|---|
| Sodium chloride | 38 g |
| Potassium bromide | 32 g |
| Potassium hexachloroiridate (III) (0.005% KCl, 20% aqueous solution) | 5 ml |
| Ammonium hexachlororhodate (0.001% NaCl, 20% aqueous solution) | 7 ml |

Liquid 4:

| Water | 100 ml |
|---|---|
| Silver nitrate | 50 g |

Liquid 5:

| Water | 100 ml |
|---|---|
| Sodium chloride | 13 g |
| Potassium bromide | 11 g |
| Potassium ferrocyanide | 5 mg |

Thereafter, according to a common method, the resultant was washed with water by a flocculation method. Specifically, the resultant was cooled to 35° C., and the pH thereof was reduced by using sulfuric acid until the silver halide was precipitated (pH was within a range of 3.6±0.2). Then, about 3 L of supernatant liquid was removed (first washing with water). Subsequently, 3 L of distilled water was added thereto, and then sulfuric acid was added thereto until the silver halide was precipitated. Thereafter, 3 L of supernatant liquid was removed again (second washing with water). The same operation as the second washing with water was repeated once (third washing with water), and then the step of washing with water and demineralization was ended. The pH and pAg of the emulsion obtained after the washing with water and demineralization were adjusted to 6.4 and 7.5, respectively. Subsequently, by adding 2.5 g of gelatin, 10 mg of sodium benzene thiosulfonate, 3 mg of sodium benzene thiosulfinate, 15 mg of sodium thiosulfate, and 10 mg of chloroauric acid to the emulsion, chemical sensitization was performed on the emulsion such that the emulsion exhibited optimal sensitivity at 55° C. Thereafter, 100 mg of 1,3,3a,7-tetraazaindene as a stabilizer and 100 mg of Proxel (trade name, manufactured by ICI Co., Ltd.) as a preservative were added thereto. The finally obtained emulsion was an emulsion of cubic silver iodochlorobromide particles that contained 0.08 mol % of silver iodide and silver chlorobromide composed of silver chloride and silver bromide at a ratio of 70 mol % and 30 mol %, and had an average particle size of 0.22 μm and a coefficient of variation of 9%.

(Preparation of Composition for Forming Photosensitive Layer)

To the aforementioned emulsion, 1,3,3a,7-tetraazaindene in an amount of $1.2 \times 10^{-4}$ mol/mol Ag, hydroquinone in an amount of $1.2 \times 10^{-2}$ mol/mol Ag, citric acid in an amount of $3.0 \times 10^{-4}$ mol/mol Ag, 2,4-dichloro-6-hydroxy-1,3,5-triazine sodium salt in an amount of 0.90 g/mol Ag, and a very small amount of a film hardening agent were added. Then, by using citric acid, the pH of the coating liquid was adjusted to 5.6.

To the coating liquid, polymer latex containing a polymer represented by (P-1) exemplified above and a dispersant composed of a dialkylphenyl PEO sulfuric acid ester (a mass ratio of dispersant/polymer was 2.0/100=0.02) was added such that a mass ratio of the polymer to the gelatin contained in the coating liquid became 0.5 (a mass ratio of polymer/gelatin became 0.5/1).

Thereafter, as a crosslinking agent, EPOXY RESIN DY 022 (trade name: manufactured by Nagase ChemteX Corporation.) was further added to the resultant. The amount of the crosslinking agent was adjusted such that the amount of the crosslinking agent in the silver halide-containing photosensitive layer, which will be described later, became 0.09 g/m$^2$.

In this way, a composition for forming a photosensitive layer was prepared.

The polymer represented by (P-1) exemplified above was synthesized with reference to JP 3305459 B and JP 3754745 B.

(Photosensitive Layer-Forming Step)

A polyethylene terephthalate (PET) film having a thickness of 100 μm was coated with the aforementioned polymer latex, thereby forming an undercoat layer having a thickness of 0.05 μm.

Thereafter, the undercoat layer was coated with a composition for forming a silver halide-free layer, which was obtained by mixing the polymer latex and gelatin together, thereby forming a silver halide-free layer having a thickness of 1.0 μm. The mixing ratio (polymer/gelatin) of the polymer to the gelatin was 2/1 in terms of mass, and the content of the polymer was 0.65 g/m$^2$.

Subsequently, the silver halide-free layer was coated with the composition for forming a photosensitive layer, thereby forming a silver halide-containing photosensitive layer having a thickness of 2.5 μm. The content of the polymer in the silver halide-containing photosensitive layer was 0.22 g/m$^2$.

Then, the silver halide-containing photosensitive layer was coated with a composition for forming a protective layer that was obtained by mixing the polymer latex and the gelatin together, thereby forming a protective layer having a thickness of 0.15 μm. The mixing ratio (polymer/gelatin) of the polymer to the gelatin was 0.1/1 in terms of mass, and the content of the polymer was 0.015 g/m$^2$.

(Exposure and Development Step)

Figure 2:
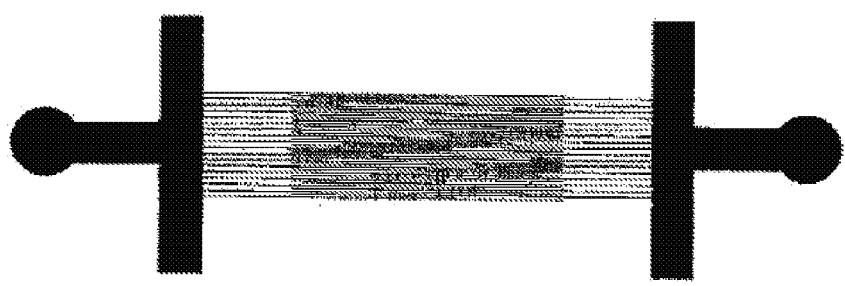
FIG. 2 is a schematic view showing a comb-like pattern electrode used in tests in the section of examples.

The photosensitive layer prepared as above was exposed to parallel light from a high-pressure mercury lamp as a light source, through photomask that can give a developed silver image having a test pattern shown in FIG. 2. The migration test pattern was a pattern based on IPC-TM650 or SM840. In this pattern, a line width was 50 μm, a space width was 50 μm, and a number of lines was 17/18 (hereinafter, the pattern will be referred to as a comb-like pattern electrode). Furthermore, a plurality of the photosensitive layers obtained as above was separately prepared, and in order to prepare other samples for evaluation, the respective photosensitive layers were exposed to parallel light from a high-pressure mercury lamp as a light source, through a lattice-like photomask giving a conductive pattern in which conductive portion/non-conductive portion was 5.0 µm/295 µm, 4.0 µm/296 µm, 3.0 µm/297 µm, 2.5 µm/297.5 µm, and 2.0 µm/298 µm (hereinafter, the sample will be referred to as a mesh pattern electrode as appropriate). In addition, a plurality of the photosensitive layers obtained as above was separately prepared, and the respective photosensitive layers were exposed to parallel light from a high-pressure mercury lamp as a light source, through a stripe-like photomask giving a conductive pattern in which conductive portion/non-conductive portion was 600 µm/400 µm and 10 µm/10,000 µm (hereinafter, the sample will be referred to as a stripe pattern electrode as appropriate).

After the exposure, the samples were developed with following developer and further subjected to development treatment by using a fixing solution (trade name: N3X-R for CN16X, manufactured by FUJIFILM Corporation). Thereafter, the samples were rinsed with pure water and dried, thereby obtaining a sample A having a comb-like pattern electrode, a sample B having a mesh pattern electrode of 5.0 µm/295 µm, a sample C having a mesh pattern electrode of 4.0 µm/296 µm, a sample D having a mesh pattern electrode of 3.0 µm/297 µm, a sample E having a mesh pattern electrode of 2.5 µm/297.5 µm, a sample F having a mesh pattern electrode of 2.0 µm/298 µm, a sample G having a stripe pattern electrode of 600 µm/400 µm, and a sample H having a stripe pattern electrode of 10 µm/10,000 µm.

(Composition of Developer)

| 1 L of the developer contained the following compounds. | |
|---|---|
| Hydroquinone | 0.037 mol/L |
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Gelatin Decomposition Treatment)

Each of the samples A to H obtained as above was dipped into an aqueous solution of sodium hypochlorite for 90 seconds, and then rinsed with pure water.

[Various Evaluations]

(Evaluation of Migration)

The sample A having the comb-like pattern electrode prepared as above was left to standstill in a moist-heat environment at 85° C. and 85% RH, wiring was connected to both ends of the sample A, and a direct current of 18 V was continuously applied thereto from one end. After a certain period of time, the sample was taken out of the environment at 85° C. and 85% RH, and by using R8340A manufactured by ADVANTEST CORPORATION, a voltage of a direct current of 18 V was applied thereto. In this way, the insulation resistance of the sample was measured and evaluated according to the following criteria.

"A": The value of insulation resistance was equal to or greater than $10^{10} \Omega$ for a time period equal to or longer than 1,000 hours.

"AB": The value of insulation resistance was reduced to be less than $10^{10} \Omega$ for a time period equal to or longer than 750 hours and less than 1,000 hours.

"B": The value of insulation resistance was reduced to be less than $10^{10} \Omega$ for a time period equal to or longer than 500 hours and less than 750 hours.

"C": The value of insulation resistance was reduced to be less than $10^{10} \Omega$ for a time period less than 500 hours.

(Evaluation of Value of Haze)

By using TC-HIII manufactured by NIPPON DENSHOKU INDUSTRIES Co., LTD, the value of haze of the sample C having a mesh pattern electrode was measured by the method based on JIS-K-7105. The value of haze was evaluated according to the following criteria.

"A": The value of haze was less than 6%.

"B": The value of haze was equal to or greater than 6% and less than 10%.

"C": The value of haze was equal to or greater than 10%.

(Evaluation of Adhesiveness)

By using the samples B and E having a mesh pattern electrode, the adhesiveness was evaluated by the cross-cut method based on JIS-K-5600. The adhesiveness was evaluated according to the following criteria. When peeling occurred in one of the samples, the sample was evaluated to be "B".

"A": Peeling did not occur.

"B": Peeling occurred.

(Evaluation of Surface Quality at the Time of Development Treatment)

The sample F having a mesh pattern electrode was developed with the developer. At this time, a sample in which peeling of a film did not occur was evaluated to be "A", and a sample in which peeling of a film occurred was evaluated to be "B".

(Evaluation of Surface Quality at the Time of Oxidation Treatment)

The sample F having a mesh pattern electrode was oxidized by the (Gelatin decomposition treatment) described above. At this time, a sample in which peeling of a film did not occur was evaluated to be "A", and a sample in which peeling of a film occurred was evaluated to be "B".

(Evaluation of Value of Resistance)

By using the sample D having a mesh pattern electrode, the values of resistance in 10 random sites were measured using a resistivity meter (Loresta manufactured by Mitsubishi Chemical Analytech Co., Ltd.: using 4 probes in series (ASP)). The average of the values was taken as a value of surface resistance. The value of surface resistance was evaluated according to the following criteria.

"A": The value of surface resistance was less than 50 Ω/sq.

"B": The value of surface resistance was equal to or greater than 50 Ω/sq and less than 100 Ω/sq.

"C": The value of surface resistance was equal to or greater than 100 Ω/sq.

(Evaluation of Value of Contact Resistance)

Figure 5:
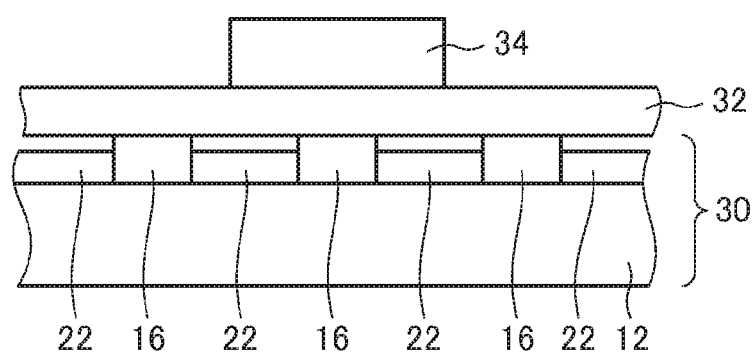
FIG. 5 is a schematic cross-sectional view of a contact resistance measurement apparatus used in examples.

By using the sample G having a stripe pattern electrode, the contact resistance was measured using a contact resistance measuring apparatus shown in FIG. 5. Specifically, on the sample G (30) having a stripe pattern electrode, which includes the support 12, the conductive portions 16 disposed on the support 12, and the resin binder portions 22 disposed between the conductive portions 16, a metal mesh 32 made of copper having a line width of 50 µm and an opening pitch of 160 µm was placed, and a weight 34 weighing 100 g was put on the central portion of the mesh. Thereafter, by using a resistivity meter (Loresta manufactured by Mitsubishi Chemical Analytech Co., Ltd.: using 4 probes in series (ASP)), the resistance of 10 sites in the stripe pattern electrode and the resistance of the metal mesh within a range of a straight-line distance of 1 cm from a point of contact between the stripe pattern and the metal mesh made of copper were measured. The average of the resistance was taken as the value of contact resistance. The value of contact resistance was evaluated according to the following criteria. "A" is most preferable.

"A": The value of contact resistance was less than 10 Ω.

"AB": The value of contact resistance was equal to or greater than 10Ω and less than 1,000 Ω.

"B": The value of contact resistance was equal to or greater than 1,000Ω and less than 100 kΩ.

"C": The value of contact resistance was equal to or greater than 100 kΩ.

(Scratch Test)

By using the sample H having a stripe pattern electrode, whether or not the wires of the conductive portions were broken after a scratch test was checked. Specifically, the sample H having a stripe pattern electrode was set in a scratch meter "HEIDON-18" manufactured by Shinto Scientific Co., Ltd. according to the prescribed method. Then, by using a scratch needle having a diameter of 1 mm, a load of 0 g to 200 g was continuously applied to 9 stripe wirings of the sample H. Thereafter, whether or not the wires were broken was checked using Loresta manufactured by Mitsubishi Chemical Analytech Co., Ltd., and the result was evaluated according to the following criteria.

"A": All of the 9 wirings were conductive.

"B": Among 9 wirings, 6 to 8 wirings were conductive.

"C": Among 9 wirings, 1 to 5 wirings were conductive.

(Method for Measuring Average Thickness)

The average thickness of the respective layers (the lower layer and the upper layer in the conductive portion, the non-conductive portion (resin binder portion), and the like) can be measured by cutting the sample C with a microtome, FIB, or the like, and then imaging and observing the cross-sectional shape thereof with a transmission electron microscope, a scanning electron microscope, a laser microscope, or the like. The method for detecting a metal is not particularly limited, and it is possible to use a technique such as energy dispersive X-ray spectrometry (EDX). When the metal portion easily collapses due to cutting or the like, the sample may be cut after the hole portion or surface thereof is fortified with a curable resin and the like.

(Hydrophobization Rate A)

By using the sample B having a mesh pattern electrode, the quantity of insolubles was determined, and the hydrophobization rate A was calculated by the following equation. Specifically, the sample B having a mesh pattern electrode was dried for 24 hours at 110° C. in advance, and the mass (mass X (g)) thereof in an absolute dry state was measured. Thereafter, the sample was dipped into a sodium hypochlorite solution (25° C.) having an effective chlorine concentration of 5% for 10 minutes and then washed with flowing water at 20° C. for 5 minutes. The sample was then dried again for 24 hours at 110° C., and the mass (mass Y (g)) thereof in an absolute dry state was measured.

Furthermore, by using the mass (mass Z (g)) of only the support used in the sample B, the hydrophobization rate A1 was calculated by the following equation. Herein, 5 sheets of the sample B were prepared, the hydrophobization rate A1 of each of the 5 sheets was calculated by the following equation, and the arithmetic mean thereof was taken as the hydrophobization rate A of the respective samples.

Hydrophobization rate $A1=[\text{mass } Y-\text{mass } Z]/[\text{mass } X-\text{mass } Z]\times 100$ (Hydrophobization Rate B)

By using the sample B having a mesh pattern electrode, the quantity of insolubles was determined, and the hydrophobization rate B was calculated by the following equation. Specifically, the sample B having a mesh pattern electrode was dried for 24 hours at 110° C. in advance, and the mass (mass M (g)) thereof in an absolute dry state was measured. Thereafter, the sample was dipped into hot water at 70° C. for 1 hour and then dried again for 24 hours at 110° C., and the mass (mass N (g)) thereof in an absolute dry state was measured.

Furthermore, by using the mass (mass Z (g)) of only the support used in the sample B, the hydrophobization rate B1 was calculated by the following equation. Herein, 5 sheets of the sample B and 5 sheets of the sample E were prepared, the hydrophobization rate B1 of each of the 10 sheets was calculated by the following equation, and the arithmetic mean thereof was taken as the hydrophobization rate B of the respective samples.

Hydrophobization rate $B1=[\text{mass } N-\text{mass } Z]/[\text{mass } M-\text{mass } Z]\times 100$ Example 2

Samples were prepared and subjected to various evaluations according to the same procedure as in Example 1, except that the following (Reduction treatment) was performed after the aforementioned (Gelatin decomposition treatment). The results are summarized in Table 1.

(Reduction Treatment)

The samples were dipped into the following reduction treatment solution for 360 seconds, and then washed with pure water.

(Composition of Reduction Treatment Solution)

1 L of the reduction treatment solution contained the following compounds.

| | |
|---|---|
| Hydroquinone | 0.20 mol/L |
| Potassium hydroxide | 0.45 mol/L |
| Potassium carbonate | 0.24 mol/L |

Example 3

Samples were prepared and subjected to various evaluations according to the same procedure as in Example 2, except that in the silver halide-containing photosensitive layer, the mixing ratio (polymer/gelatin) of the polymer to the gelatin was changed to 1/1 from 0.5/1 in terms of mass, and the content of the polymer was changed to 0.44 g/m$^2$ from 0.22 g/m$^2$. The results are summarized in Table 1.

Example 4

Samples were prepared and subjected to various evaluations according to the same procedure as in Example 2, except that in the silver halide-containing photosensitive layer, the mixing ratio (polymer/gelatin) of the polymer to the gelatin was changed to 2/1 from 0.5/1 in terms of mass, and the content of the polymer was changed to 0.88 g/m$^2$ from 0.22 g/m$^2$. The results are summarized in Table 1.

Example 5

Samples were prepared and subjected to various evaluations according to the same procedure as in Example 2, except that in the silver halide-containing photosensitive layer, the mixing ratio (polymer/gelatin) of the polymer to the gelatin was changed to 0.1/1 from 0.5/1 in terms of mass, and the content of the polymer was changed to 0.044 g/m$^2$ from 0.22 g/m$^2$. The results are summarized in Table 1.

Example 6

Samples were prepared and subjected to various evaluations according to the same procedure as in Example 2, except that in the silver halide-free layer, the mixing ratio (polymer/gelatin) of the polymer to the gelatin was changed to 3/1 from 2/1 in terms of mass, and the content of the polymer was changed to 0.975 g/m² from 0.65 g/m². The results are summarized in Table 1.

Example 7

Samples were prepared and subjected to various evaluations according to the same procedure as in Example 2, except that in the silver halide-free layer, the mixing ratio (polymer/gelatin) of the polymer to the gelatin was changed to 1/1 from 2/1 in terms of mass, and the content of the polymer was changed to 0.325 g/m² from 0.65 g/m². The results are summarized in Table 1.

Example 8

Samples were prepared and subjected to various evaluations according to the same procedure as in Example 2, except that in the silver halide-free layer, the mixing ratio (polymer/gelatin) of the polymer to the gelatin was changed to 0.5/1 from 2/1 in terms of mass, and the content of the polymer was changed to 0.1625 g/m² from 0.65 g/m². The results are summarized in Table 1.

Example 9

Samples were prepared and subjected to various evaluations according to the same procedure as in Example 2, except that in the silver halide-free layer, the mixing ratio (polymer/gelatin) of the polymer to the gelatin was changed to 0.1/1 from 2/1 in terms of mass, and the content of the polymer was changed to 0.0325 g/m² from 0.65 g/m². The results are summarized in Table 1.

Example 10

Samples were prepared and subjected to various evaluations according to the same procedure as in Example 2, except that the protective layer was not formed. The results are summarized in Table 1.

Example 11

Samples were prepared and subjected to various evaluations according to the same procedure as in Example 2, except that in the protective layer, the mixing ratio (polymer/gelatin) of the polymer to the gelatin was changed to 1/1 from 0.1/1 in terms of mass, and the content of the polymer was changed to 0.15 g/m² from 0.015 g/m². The results are summarized in Table 1.

Example 12

Samples were prepared and subjected to various evaluations according to the same procedure as in Example 2, except that in the protective layer, the mixing ratio (polymer/gelatin) of the polymer to the gelatin was changed to 2/1 from 0.1/1 in terms of mass, and the content of the polymer was changed to 0.3 g/m² from 0.015 g/m². The results are summarized in Table 1.

Example 13

Samples were prepared and subjected to various evaluations according to the same procedure as in Example 2, except that the crosslinking agent was not used. The results are summarized in Table 1.

Example 14

Samples were prepared and subjected to various evaluations according to the same procedure as in Example 2, except that the following (Xenon treatment) was performed after the aforementioned (Reduction treatment). The results are summarized in Table 1.

(Xenon Treatment)

By using a xenon flash lamp manufactured by XENON Corporation, the samples were irradiated with pulsed light for 125 seconds. At this time, the input energy of the lamp (lamp power) per session of irradiation was set to be 926 J, the pulse width of the pulsed light (irradiation time of the pulsed light per session) was set to be 120 microseconds, and the irradiation interval was set to be 0.1 seconds.

Example 15

Samples were prepared and subjected to various evaluations according to the same procedure as in Example 2, except that the surface of the polyethylene terephthalate (PET) film having a thickness of 100 μm was subjected to the following atmospheric pressure plasma treatment, and an undercoat layer was formed on the treated surface. The results are summarized in Table 1.

(Atmospheric Pressure Plasma Treatment)

In a nitrogen gas atmosphere, the PET support was subjected to atmospheric pressure plasma treatment at 40 W·m/s while being transported by rolls.

Example 16

Samples were prepared and subjected to various evaluations according to the same procedure as in Example 2, except that the following (Calender treatment (1)) was performed after the (Reduction treatment). The results are summarized in Table 1.

(Calender Treatment (1))

By using plastic rolls, calender treatment was performed on the sample in a state of transporting the sample between rollers by applying a linear pressure of 1,960 N/cm (200 Kgf/cm). The surface roughness Ra of the plastic rolls used was 0.6 μm.

Example 17

Samples were prepared and subjected to various evaluations according to the same procedure as in Example 2, except that the following (Calender treatment (2)) was performed after the (Reduction treatment). The results are summarized in Table 1.

(Calender Treatment (2))

By using mirror-finished metal rolls, calender treatment was performed on the sample in a state of transporting the sample between rollers by applying a linear pressure of 1,960 N/cm (200 Kgf/cm).

Example 18

Samples were prepared and subjected to various evaluations according to the same procedure as in Example 2, except that the following (Heating treatment (1)) was performed between the (Exposure and development treatment) and the (Gelatin decomposition treatment). The results are summarized in Table 1.

(Heating Treatment (1))

The sample was treated for 130 seconds in a superheated vapor tank at 120° C.

Example 19

Samples were prepared and subjected to various evaluations according to the same procedure as in Example 2, except that the (Heating treatment (1)) performed in Example 18 was performed after the (Reduction treatment). The results are summarized in Table 1.

Example 20

Samples were prepared and subjected to various evaluations according to the same procedure as in Example 2, except that the (Heating treatment (1)) performed in Example 18 was performed between the (Exposure and development treatment) and the (Gelatin decomposition treatment) and after the (Reduction treatment). The results are summarized in Table 1.

Example 21

Samples were prepared and subjected to various evaluations according to the same procedure as in Example 20, except that the following (Heating treatment (2)) was performed instead of the (Heating treatment (1)). The results are summarized in Table 1.

(Heating Treatment (2))

The sample was left to standstill for 2 hours in an environment at 120° C.

Example 22

Samples were prepared and subjected to various evaluations according to the same procedure as in Example 2, except that the following (Stabilization treatment) was performed after the (Reduction treatment). The results are summarized in Table 1.

(Stabilization Treatment)

The sample was dipped into an aqueous solution, which contained a compound A in an amount of 0.375% by mass and a compound B in an amount of 0.125% by mass, for 90 seconds. The sample was then washed with pure water and dried.

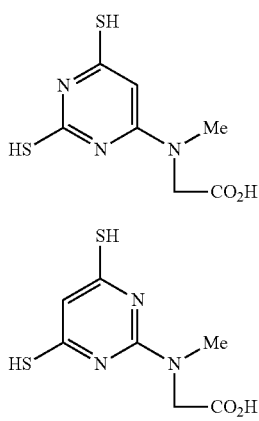

Compound A

Compound B

Example 23

Samples were prepared and subjected to various evaluations according to the same procedure as in Example 2, except that the following (Organic solvent contact treatment) was performed after the (Reduction treatment). The results are summarized in Table 1.

(Organic Solvent Contact Treatment)

The sample was dipped in benzyl alcohol for 90 seconds and then dried for 20 minutes at 65° C.

Example 24

Samples were prepared and subjected to various evaluations according to the same procedure as in Example 2, except that the (Heating treatment (1)) performed in Example 18 was performed between the (Exposure and development treatment) and the (Gelatin decomposition treatment), and the (Calender treatment), the (Heating treatment (1)), the (Stabilization treatment), and the (Organic solvent contact treatment) were performed in this order after the (Reduction treatment). The results are summarized in Table 1.

Example 25

Samples were prepared and subjected to various evaluations according to the same procedure as in Example 24, except that the content of the polymer in the protective layer was changed to 0.3 g/m$^2$. The results are summarized in Table 1.

Example 26

Samples were prepared and subjected to various evaluations according to the same procedure as in Example 2, except that in the silver halide-free layer, the mixing ratio (polymer/gelatin) of the polymer to the gelatin was changed to 0.1/1 from 2/1 in terms of mass, and the content of the polymer was changed to 0.025 g/m$^2$ from 0.65 g/m$^2$. The results are summarized in Table 1.

Comparative Example 1

Samples were prepared and subjected to various evaluations according to the same procedure as in Example 1, except that the (Gelatin decomposition treatment) was not performed. The results are summarized in Table 1.

Comparative Example 2

Samples were prepared and subjected to various evaluations according to the same procedure as in Example 1, except that the following (Enzyme treatment) was performed instead of the (Gelatin decomposition treatment). The results are summarized in Table 1.

(Enzyme Treatment)

The sample was dipped into the following enzyme treatment solution (40° C.) for 30 seconds and then washed with hot water at 70° C. for 10 seconds.

[Formulation of Enzyme Treatment Solution]

| | |
|---|---|
| Triethanolamine | 20 g |
| Potassium bisulfite | 6 g |
| Aminotrimethylene phosphonic acid | 20 g |
| Bioprase AL-15 (manufactured by NAGASE & CO., LTD.) | 1 g |

By adding water, the total amount of the solution was adjusted to 1,000 ml, and the pH thereof was adjusted to 7.4.

In Table 1, "Evaluation of MG" means the evaluation of migration.

In Table 1, the column of "Thickness of upper layer (μm)" shows the average thickness of the upper layer in the conductive portion.

In Table 1, the column of "Burial depth (μm)" shows a difference (T2−T3) between the average thickness T2 of the aforementioned resin binder portion and the average thickness T3 of the lower layer in the conductive portion.

TABLE 1

| Support | Silver halide free layer | | silver halide-containing photosensitive layer | | Protective layer | | Epoxy crosslinking agent | Type of support |
|---|---|---|---|---|---|---|---|---|
| | Content of polymer (g/m$^2$) | Polymer/gelatin (mass ratio) | Content of polymer (g/m$^2$) | Polymer/gelatin (mass ratio) | Content of polymer (g/m$^2$) | Polymer/gelatin (mass ratio) | | |
| Example 1 | 0.65 | 2/1 | 0.22 | 0.5/1 | 0.015 | 0.1/1 | Contained | Support having undercoat layer |
| Example 2 | 0.65 | 2/1 | 0.22 | 0.5/1 | 0.015 | 0.1/1 | Contained | Support having undercoat layer |
| Example 3 | 0.65 | 2/1 | 0.44 | 1/1 | 0.015 | 0.1/1 | Contained | Support having undercoat layer |
| Example 4 | 0.65 | 2/1 | 0.88 | 2/1 | 0.015 | 0.1/1 | Contained | Support having undercoat layer |
| Example 5 | 0.65 | 2/1 | 0.044 | 0.1/1 | 0.015 | 0.1/1 | Contained | Support having undercoat layer |
| Example 6 | 0.975 | 3/1 | 0.22 | 0.5/1 | 0.015 | 0.1/1 | Contained | Support having undercoat layer |
| Example 7 | 0.325 | 1/1 | 0.22 | 0.5/1 | 0.015 | 0.1/1 | Contained | Support having undercoat layer |
| Example 8 | 0.1625 | 0.5/1 | 0.22 | 0.5/1 | 0.015 | 0.1/1 | Contained | Support havin undercoat layer |
| Example 9 | 0.0325 | 0.1/1 | 0.22 | 0.5/1 | 0.015 | 0.1/1 | Contained | Support having undercoat layer |
| Example 10 | 0.65 | 2/1 | 0.22 | 0.5/1 | — | — | Contained | Support having undercoat layer |
| Example 11 | 0.65 | 2/1 | 0.22 | 0.5/1 | 0.15 | 1/1 | Contained | Support having undercoat layer |
| Example 12 | 0.65 | 2/1 | 0.22 | 0.5/1 | 0.3 | 2/1 | Contained | Support having undercoat layer |
| Example 13 | 0.65 | 2/1 | 0.22 | 0.5/1 | 0.015 | 0.1/1 | Not Contained | Support having undercoat layer |
| Example 14 | 0.65 | 2/1 | 0.22 | 0.5/1 | 0.015 | 0.1/1 | Contained | Support having undercoat layer |
| Example 15 | 0.65 | 2/1 | 0.22 | 0.5/1 | 0.015 | 0.1/1 | Contained | Support having undergone atmospheric pressure plasma treatment |
| Example 16 | 0.65 | 2/1 | 0.22 | 0.5/1 | 0.015 | 0.1/1 | Contained | Support having undercoat layer |
| Example 17 | 0.65 | 2/1 | 0.22 | 0.5/1 | 0.015 | 0.1/1 | Contained | Support having undercoat layer |
| Example 18 | 0.65 | 2/1 | 0.22 | 0.5/1 | 0.015 | 0.1/1 | Contained | Support having undercoat layer |
| Example 19 | 0.65 | 2/1 | 0.22 | 0.5/1 | 0.015 | 0.1/1 | Contained | Support having undercoat layer |
| Example 20 | 0.65 | 2/1 | 0.22 | 0.5/1 | 0.015 | 0.1/1 | Contained | Support having undercoat layer |
| Example 21 | 0.65 | 2/1 | 0.22 | 0.5/1 | 0.015 | 0.1/1 | Contained | Support having undercoat layer |
| Example 22 | 0.65 | 2/1 | 0.22 | 0.5/1 | 0.015 | 0.1/1 | Contained | Support having undercoat layer |
| Example 23 | 0.65 | 2/1 | 0.22 | 0.5/1 | 0.015 | 0.1/1 | Contained | Support having undercoat layer |
| Example 24 | 0.65 | 2/1 | 0.22 | 0.5/1 | 0.015 | 0.1/1 | Contained | Support having undercoat layer |
| Example 25 | 0.65 | 2/1 | 0.22 | 0.5/1 | 0.3 | 0.1/1 | Contained | Support having undercoat layer |
| Example 26 | 0.025 | 0.1/1 | 0.22 | 0.5/1 | 0.015 | 0.1/1 | Contained | Support having undercoat layer |
| Comparative example 1 | 0.65 | 2/1 | 0.22 | 0.5/1 | 0.015 | 0.1/1 | Contained | Support having undercoat layer |
| Comparative example 2 | 0.65 | 2/1 | 0.22 | 0.5/1 | 0.015 | 0.1/1 | Contained | Support having undercoat layer |

TABLE 1-continued

|  | Oxidant treatment step | Reduction step | Light irradiation step | Smoothing step Performed/not performed | Surface roughness Ra of roll (μm) | Heating step Before oxidation treament | Heating step After reduction treatment | Stabilization step | Organic solvent contact step |
|---|---|---|---|---|---|---|---|---|---|
| Example 1 | Performed | Not performed | Not performed | Not performed | — | Not performed | Not performed | Not performed | Not performed |
| Example 2 | Performed | Performed | Not performed | Not performed | — | Not performed | Not performed | Not performed | Not performed |
| Example 3 | Performed | Performed | Not performed | Not performed | — | Not performed | Not performed | Not performed | Not performed |
| Example 4 | Performed | Performed | Not performed | Not performed | — | Not performed | Not performed | Not performed | Not performed |
| Example 5 | Performed | Performed | Not performed | Not performed | — | Not performed | Not performed | Not performed | Not performed |
| Example 6 | Performed | Performed | Not performed | Not performed |  | Not performed | Not performed | Not performed | Not performed |
| Example 7 | Performed | Performed | Not performed | Not performed | — | Not performed | Not performed | Not performed | Not performed |
| Example 8 | Performed | Performed | Not performed | Not performed | — | Not performed | Not performed | Not performed | Not performed |
| Example 9 | Performed | Performed | Not performed | Not performed | — | Not performed | Not performed | Not performed | Not performed |
| Example 10 | Performed | Performed | Not performed | Not performed | — | Not performed | Not performed | Not performed | Not performed |
| Example 11 | Performed | Performed | Not performed | Not performed |  | Not performed | Not performed | Not performed | Not performed |
| Example 12 | Performed | Performed | Not performed | Not performed | — | Not performed | Not performed | Not performed | Not performed |
| Example 13 | Performed | Performed | Not performed | Not performed |  | Not performed | Not performed | Not performed | Not performed |
| Example 14 | Performed | Performed | Performed | Not performed | — | Not performed | Not performed | Not performed | Not performed |
| Example 15 | Performed | Performed | Not performed | Not performed |  | Not performed | Not performed | Not performed | Not performed |
| Example 16 | Performed | Performed | Not performed | Performed | 0.6 | Not performed | Not performed | Not performed | Not performed |
| Example 17 | Performed | Performed | Not performed | Performed | Mirror surface | Not performed | Not performed | Not performed | Not performed |
| Example 18 | Performed | Performed | Not performed | Not performed | — | Superheated vapor | Not performed | Not performed | Not performed |
| Example 19 | Performed | Performed | Not performed | Not performed | — | Not performed | Superheated vapor | Not performed | Not performed |
| Example 20 | Performed | Performed | Not performed | Not performed | — | Superheated vapor | Superheated vapor | Not performed | Not performed |
| Example 21 | Performed | Performed | Not performed | Not performed | — | 120° C. | 120° C. | Not performed | Not performed |
| Example 22 | Performed | Performed | Not performed | Not performed | — | Not performed | Not performed | Performed | Not performed |
| Example 23 | Performed | Performed | Not performed | Not performed | — | Not performed | Not performed | Not performed | Performed |
| Example 24 | Performed | Performed | Not performed | Performed | 0.6 | Superheated vapor | Superheated vapor | Performed | Performed |
| Example 25 | Performed | Performed | Not performed | Performed | 0.6 | Superheated vapor | Superheated vapor | Performed | Performed |
| Example 26 | Performed | Performed | Not performed | Not performed | — | Not performed | Not performed | Not performed | Not performed |
| Comparative example 1 | Not performed | Not performed | Not performed | Not performed | — | Not performed | Not performed | Not performed | Not performed |
| Comparative example 2 | Not performed (enzyme teatment was performed) | Not performed | Not performed | Not performed | — | Not performed | Not performed | Not performed | Not performed |

|  | Various evaluations |  |  |  |  |  |  |  |  |  |  |  |
|---|---|---|---|---|---|---|---|---|---|---|---|---|
|  | Evaluation of MG | Evaluation of haze | Evaluation of adhesiveness | Scratch test | Evaluation of surface quality at the time of development treatment | Evaluation of surface quality at the time of oxidation treatment | Evaluation of value of resistance | Evaluation of value of contact resistance | Thickness of upper layer (μm) | Burial depth (μm) | Hydrophobization rate A | Hydrophobization rate A |
| Example 1 | B | C | B | B | A | B | C | A | 0.04 | 0.25 | 92 | 87 |
| Example 2 | B | C | B | B | A | B | B | A | 0.04 | 0.25 | 92 | 88 |
| Example 3 | B | C | B | A | A | B | B | A | 0.04 | 0.31 | 93 | 87 |
| Example 4 | B | C | A | A | A | B | C | A | 0.04 | 0.50 | 91 | 87 |
| Example 5 | B | C | B | B | A | B | B | A | 0.04 | 0.22 | 96 | 87 |
| Example 6 | B | C | B | A | A | A | B | A | 0.04 | 0.55 | 92 | 87 |
| Example 7 | B | C | B | B | A | B | B | A | 0.04 | 0.10 | 92 | 89 |
| Example 8 | B | C | B | B | A | B | B | A | 0.04 | 0.08 | 92 | 87 |
| Example 9 | B | C | B | B | A | B | B | A | 0.04 | 0.03 | 93 | 87 |
| Example 10 | B | C | B | B | A | B | B | A | Equal to or less than 0.04 | 0.25 | 95 | 87 |
| Example 11 | B | C | B | B | A | B | B | AB | 0.18 | 0.24 | 95 | 87 |
| Example 12 | B | C | B | B | A | B | C | B | 0.35 | 0.24 | 91 | 87 |
| Example 13 | B | C | B | B | B | B | B | A | 0.04 | 0.25 | 95 | 88 |
| Example 14 | B | C | B | B | A | B | B | A | 0.04 | 0.26 | 95 | 87 |

TABLE 1-continued

| | | | | | | | | | | | | |
|---|---|---|---|---|---|---|---|---|---|---|---|---|
| Example 15 | B | C | B | B | A | B | B | A | 0.04 | 0.25 | 94 | 88 |
| Example 16 | B | C | A | B | A | B | A | A | 0.04 | 0.25 | 94 | 88 |
| Example 17 | B | C | A | B | A | B | A | A | 0.04 | 0.25 | 94 | 87 |
| Example 18 | AB | B | B | B | A | A | A | A | 0.04 | 0.26 | 99 | 91 |
| Example 19 | AB | B | A | B | A | B | A | A | 0.04 | 0.25 | 95 | 91 |
| Example 20 | AB | A | A | B | A | A | A | A | 0.04 | 0.25 | 99 | 98 |
| Example 21 | AB | A | A | B | A | A | A | A | 0.04 | 0.25 | 92 | 97 |
| Example 22 | A | C | B | B | A | B | B | A | 0.04 | 0.23 | 96 | 99 |
| Example 23 | B | A | A | B | A | B | B | A | 0.04 | 0.23 | 93 | 89 |
| Example 24 | A | A | A | A | A | A | A | A | 0.04 | 0.31 | 99 | 99 |
| Example 25 | A | A | A | A | A | A | A | B | 0.35 | 0.30 | 99 | 99 |
| Example 26 | B | C | B | C | A | B | B | A | 0.04 | 0.02 | 93 | 87 |
| Comparative example 1 | C | C | A | A | A | — | C | A | 0.04 | 0.50 | 47 | 63 |
| Comparative example 2 | C | C | A | B | A | — | C | A | 0.04 | 0.25 | 85 | 89 |

As shown in Table 1, the conductive sheet obtained by the manufacturing method of the present invention has an excellent ion migration-inhibiting ability. Particularly, as is evident from Examples 22 and 24, it was confirmed that the inhibiting ability becomes better when the stabilization treatment is performed.

As is evident from Examples 18 to 21 and Examples 23 to 24, the haze is improved when the heating step or the organic solvent contact step is performed. Particularly, it is preferable to perform the heating step before the oxidation treatment and after the reduction treatment.

As is evident from Examples 16 and 17, Examples 19 to 21, and Examples 23 and 24, the adhesiveness of the conductive portions is improved when the smoothing step, the heating step following the reduction treatment, or the organic solvent contact step is performed. Furthermore, as is evident from Example 4, when the amount of the polymer in the silver halide-containing photosensitive layer is large, the adhesiveness of the conductive portions is improved.

As is evident from the comparison between Example 13 and other examples, it was confirmed that when a predetermined crosslinking agent is used, the surface quality of the conductive sheet at the time the development treatment becomes excellent.

As is evident from Example 18, Examples 20 and 21, and Example 24, the surface quality at the time of the oxidation treatment is improved when the heating step is performed before the oxidation treatment. Furthermore, as is evident from Example 6, when the amount of the polymer in the silver halide-free layer is large, the surface quality at the time of the oxidation treatment is improved.

As is evident from Examples 16 to 21 and Example 24, the value of resistance is improved when the heating step or the smoothing step is performed.

As is evident from the comparison between Examples 1 and 2, the surface resistance is reduced when the reduction step is performed.

As is evident from the comparison between Examples 1 to 17 as well as 23 and other examples, it was confirmed that the ion migration-inhibiting ability becomes better when the hydrophobization rate B is equal to or greater than 90.

As is evident from the comparison between Examples 12 as well as 25 and other examples, it was confirmed that the contact resistance becomes better when the thickness of the upper layer is equal to or less than 0.20 μm.

As is evident from the comparison between Examples 3, 4, 6, 24 as well as 25 and other examples, it was confirmed that the scratch resistance becomes better when the burial thickness is equal to or greater than 0.30 μm.

As is evident from the comparison between Example 9 and Example 26, it was confirmed that the scratch resistance becomes better when the burial depth is greater than 0.02 μm.

In contrast, in Comparative example 1 in which the oxidant treatment step using a predetermined oxidant was not performed and in Comparative example 2 in which the gelatin was decomposed by using a predetermined enzyme, the ion migration-inhibiting ability was poor.

What is claimed is:

1. A manufacturing method of a conductive sheet, comprising:
    a step A of forming a silver halide-containing photosensitive layer, which contains silver halide, gelatin, and a polymer different from the gelatin and in which a mass ratio (Y/X) of a mass Y of the polymer to a mass X of the gelatin is equal to or greater than 0.1, on a support;
    a step B of forming conductive portions containing metal silver by performing exposure and then development treatment on the silver halide-containing photosensitive layer; and
    a step C of treating the support having the conductive portions with an oxidant which has a standard electrode potential of equal to or greater than +1.5 V and decomposes the gelatin.

2. The manufacturing method of a conductive sheet according to claim 1,
    wherein the oxidant is aqueous hydrogen peroxide or sodium hypochlorite.

3. The manufacturing method of a conductive sheet according to claim 1,
    wherein the silver halide-containing photosensitive layer further contains a crosslinking agent cross-linking the polymers to each other.

4. The manufacturing method of a conductive sheet according to claim 1,
    wherein the support is a treated support having undergone at least one type of treatment selected from the group consisting of atmospheric pressure plasma treatment, corona discharge treatment, and ultraviolet irradiation treatment.

5. The manufacturing method of a conductive sheet according to claim 1,
    wherein the support has an undercoat layer, which contains a polymer different from the gelatin, on the surface thereof.

6. The manufacturing method of a conductive sheet according to claim 1, further comprising, before the step A, a step of forming a silver halide-free layer, which contains gelatin and a polymer different from the gelatin, on the support.

7. The manufacturing method of a conductive sheet according to claim 1, further comprising, between the step A and the step B, a step of forming a protective layer, which contains gelatin and a polymer different from the gelatin, on the silver halide-containing photosensitive layer.

8. The manufacturing method of a conductive sheet according to claim 7,
wherein a mass ratio (the mass of the polymer/the mass of the gelatin) of the polymer to the gelatin in the protective layer is greater than 0 and equal to or less than 1.0.

9. The manufacturing method of a conductive sheet according to claim 1, further comprising, between the step B and the step C and/or after the step C, a step of performing reduction treatment by treating the support having the conductive portions with a reducing aqueous solution.

10. The manufacturing method of a conductive sheet according to claim 1, further comprising, between the step B and the step C and/or after the step C, a step of irradiating the conductive portions with pulsed light from a xenon flash lamp.

11. The manufacturing method of a conductive sheet according to claim 10,
wherein when the conductive portions are irradiated with the pulsed light from the xenon flash lamp, the irradiation energy per pulse is equal to or less than 1,500 J, and the number of times the pulsed light is radiated is equal to or less than 2,000.

12. The manufacturing method of a conductive sheet according to claim 1, further comprising, between the step B and the step C and/or after the step C, a step of performing smoothing treatment on the conductive portions.

13. The manufacturing method of a conductive sheet according to claim 12,
wherein the smoothing treatment is calender treatment in which the support having the conductive portions is passed through at least a pair of rolls under a condition of a linear pressure of 20 kgf/cm to 700 kgf/cm.

14. The manufacturing method of a conductive sheet according to claim 13,
wherein a surface roughness Ra of the rolls is 0 µm to 2.0 µm.

15. The manufacturing method of a conductive sheet according to claim 1, further comprising, between the step B and the step C and/or after the step C, a step of performing heating treatment on the support having the conductive portions.

16. The manufacturing method of a conductive sheet according to claim 15,
wherein the heating treatment is treatment for bringing the support having the conductive portions into contact with superheated vapor.

17. The manufacturing method of a conductive sheet according to claim 15,
wherein the heating treatment is heating treatment performed at 80° C. to 150° C.

18. The manufacturing method of a conductive sheet according to claim 1, further comprising, after the step C, a step of bringing the support having the conductive portions into contact with a migration inhibitor.

19. The manufacturing method of a conductive sheet according to claim 1, further comprising, after the step C, a step of bringing the support having the conductive portions into contact with an organic solvent.

20. The manufacturing method of a conductive sheet according to claim 19,
wherein the organic solvent is a solvent dissolving the polymer.

21. The manufacturing method of a conductive sheet according to claim 19,
wherein the organic solvent is an organic solvent having an SP value within a range of 8.0 to 12.0.

22. A conductive sheet comprising:
a support;
conductive portions which are disposed on the support and contain metal silver and a resin binder; and
resin binder portions each of which is present between the conductive portions,
wherein each of the conductive portions has a lower layer not containing metal silver, an intermediate layer containing metal silver, and an upper layer not containing metal silver in this order,
an average thickness of the upper layer is equal to or less than 0.40 µm, and
a hydrophobization rate A determined by the following hydrophobization rate A-measuring method is equal to or greater than 90,
(hydrophobization rate A-measuring method: 5 conductive sheets are prepared and dried for 24 hours at 110° C.; a mass X of each of the obtained conductive sheets is measured; the obtained conductive sheets are dipped into a sodium hypochlorite solution (25° C.) having an effective chlorine concentration of 5% for 10 minutes and then subjected to washing treatment (for 5 minutes) using water (20° C.); the obtained conductive sheets are dried for 24 hours at 110° C.; a mass Y of each of the obtained conductive sheets is measured; a hydrophobization rate A1 of each of the conductive sheets is calculated by using the following Equation (A); and the arithmetic mean of the values of the hydrophobization rate A1 of the 5 conductive sheets is calculated and taken as the hydrophobizing rate A, and in the Equation (A), a mass Z represents the mass of the support;

Hydrophobization rate $A1 = [\text{mass } Y - \text{mass } Z]/[\text{mass } X - \text{mass } Z] \times 100)$.    Equation (A):

23. The conductive sheet according to claim 22,
wherein a hydrophobization rate B determined by the following hydrophobization rate B-measuring method is equal to or greater than 90,
(hydrophobization rate B-measuring method: 5 conductive sheets are prepared and dried for 24 hours at 110° C.; a mass M of each of the obtained conductive sheets is measured; the obtained conductive sheets are dipped into hot water (70° C.) for 1 hour and then dried for 24 hours at 110° C.; a mass N of each of the obtained conductive sheets is measured; a hydrophobization rate B1 of the each of the conductive sheets is calculated by using the following Equation (B); and the arithmetic mean of the values of the hydrophobization rate B1 of the 5 conductive sheets is calculated and taken as the hydrophobization rate B, and in Equation (B), a mass Z represents the mass of the support;

Hydrophobization rate $B1 = [\text{mass } N - \text{mass } Z]/[\text{mass } M - \text{mass } Z] \times 100)$.    Equation (B):

24. The conductive sheet according to claim 22,
wherein an average thickness of the upper layer is equal to or less than 0.20 µm.

25. The conductive sheet according to claim 22,
wherein a difference (T2−T3) between an average thickness T2 of the resin binder portions and an average thickness T3 of the lower layer is greater than 0.02 µm.

* * * * *